United States Patent
Yoshimoto et al.

(10) Patent No.: US 9,390,791 B2
(45) Date of Patent: *Jul. 12, 2016

(54) RESISTANCE CHANGE NON-VOLATILE STORAGE MEMORY DEVICE AND METHOD

(71) Applicant: Panasonic Intellectual Property Management Co., Ltd., Osaka (JP)

(72) Inventors: Yuhei Yoshimoto, Hyogo (JP); Yoshikazu Katoh, Osaka (JP); Satoru Ogasahara, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,636

(22) Filed: Jun. 1, 2015

(65) Prior Publication Data

US 2015/0364192 A1 Dec. 17, 2015

(30) Foreign Application Priority Data

Jun. 12, 2014 (JP) .................................. 2014-121664

(51) Int. Cl.
*G11C 13/00* (2006.01)

(52) U.S. Cl.
CPC .......... *G11C 13/0007* (2013.01); *G11C 13/004* (2013.01); *G11C 13/0064* (2013.01); *G11C 13/0069* (2013.01); *G11C 2013/009* (2013.01); *G11C 2013/0073* (2013.01); *G11C 2013/0076* (2013.01); *G11C 2013/0083* (2013.01)

(58) Field of Classification Search
CPC .......... G11C 13/0007; G11C 13/0069; G11C 13/0064; G11C 2013/0095; G11C 2013/009; G11C 2013/0083

See application file for complete search history.

(56) References Cited

U.S. PATENT DOCUMENTS

| 2004/0114444 A1 | 6/2004 | Matsuoka |
| 2004/0130938 A1* | 7/2004 | Hamaguchi ........ G11C 11/5685 365/158 |
| 2010/0226164 A1 | 9/2010 | Nagashima et al. |
| 2012/0201069 A1 | 8/2012 | Honda |
| 2013/0028003 A1* | 1/2013 | Wang ................. G11C 13/0007 365/148 |
| 2013/0044534 A1* | 2/2013 | Kawai ................ G11C 13/0007 365/148 |
| 2013/0058153 A1* | 3/2013 | Chang ................ G11C 13/0007 365/148 |

FOREIGN PATENT DOCUMENTS

| JP | 2004-234707 | 8/2004 |
| JP | 2008-066438 | 3/2008 |
| JP | 2009-099199 | 5/2009 |
| JP | 2012-164399 | 8/2012 |
| JP | 2013-048004 | 3/2013 |
| WO | 2014/119329 | 8/2014 |

* cited by examiner

*Primary Examiner* — Richard Elms
*Assistant Examiner* — Ajay Ojha
(74) *Attorney, Agent, or Firm* — McDermott Will & Emery LLP

(57) ABSTRACT

A data recording method includes recording data in memory cells on the basis of whether each memory cell is in an initial state or a variable state. The recording step includes (A) applying a forming stress to a selected memory cell in the initial state, and (B) setting a resistance value of the selected memory cell to within a first resistance range by (b1) applying a first correction signal to the selected memory cell if the resistance value of the selected memory cell is greater than a first reference value, and (b2) applying a second correction signal to the selected memory cell if the resistance value of the selected memory cell is smaller than a second reference value.

16 Claims, 12 Drawing Sheets

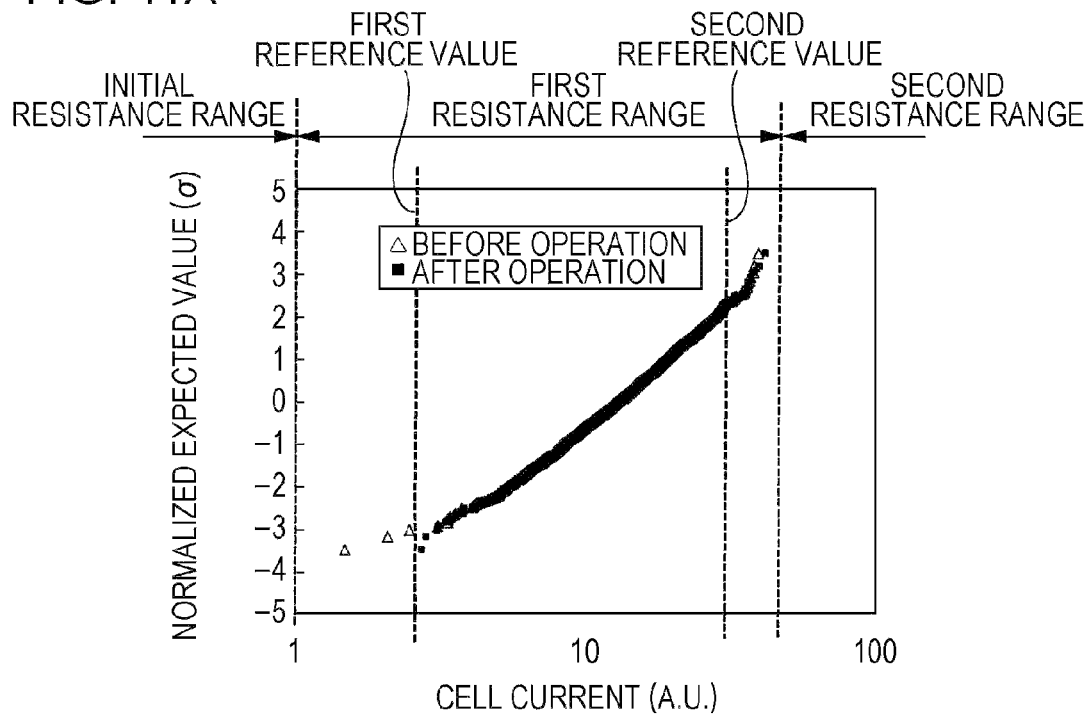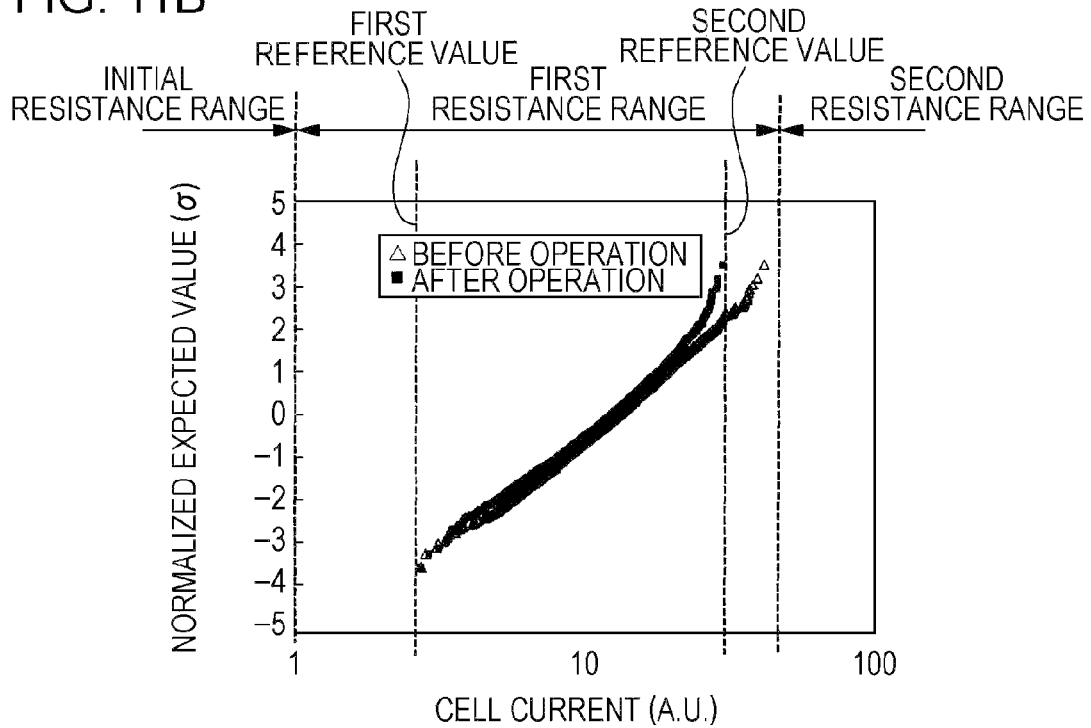

RESISTANCE CHANGE NON-VOLATILE STORAGE MEMORY DEVICE AND METHOD

BACKGROUND

1. Technical Field

The present disclosure relates to a data recording method and non-volatile storage device.

2. Description of the Related Art

Japanese Unexamined Patent Application Publication No. 2008-66438 discloses a variable resistance element for irreversible storage. The element has a first electrode, a second electrode, and thin film formed between the electrodes, the thin film containing an oxide that contains a transition metal. When an electric pulse exceeding a certain level is applied to the thin film, the electrical resistance between the two electrodes changes irreversibly.

SUMMARY

One non-limiting and exemplary embodiment provides a novel data recording method.

A data recording method according to an aspect of the present disclosure includes recording data in a plurality of memory cells on the basis of whether each of the plurality of memory cells is in an initial state in which a resistance value thereof is within an initial resistance range, or a variable state in which the resistance value thereof reversibly changes between a first resistance range and a second resistance range in response to application of an electric signal, wherein the recording step includes: (A) applying a forming stress to a memory cell selected from the plurality of memory cells in the initial state, and (B) setting the resistance value of the selected memory cell to within the first resistance range, which lies between the initial resistance range and the second resistance range without overlap, by (b1) applying a first correction signal to the selected memory cell to decrease the resistance value of the selected memory cell if the resistance value of the selected memory cell is greater than a first reference value which is within the first resistance range, and (b2) applying a second correction signal to the selected memory cell to increase the resistance value of the selected memory cell if the resistance value of the selected memory cell is smaller than a second reference value which is within the first resistance range and smaller than the first reference value.

The present disclosure may be also implemented as a non-volatile storage device and the like in addition to the method described above.

According to an aspect of the present disclosure, a novel method for recording data in a non-volatile memory can be provided, for example.

It should be noted that comprehensive or specific embodiments may be implemented as a system, a method, an integrated circuit, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 11A shows an example of distribution of resistance values before and after execution of steps S21 through S26 in FIG. 10;

FIG. 11B shows an example of distribution of resistance values before and after execution of steps S31 through S36 in FIG. 10;

DETAILED DESCRIPTION

Figure 1:
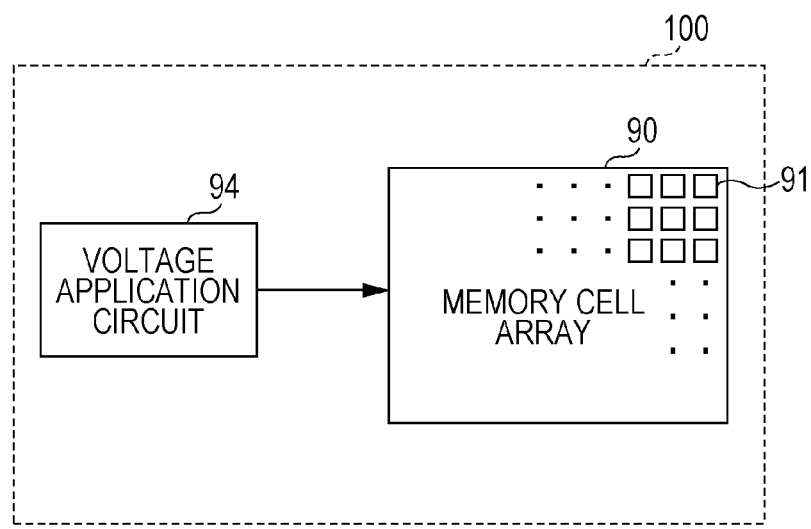
FIG. 1 is a block diagram showing an exemplary configuration of a non-volatile storage device according to an embodiment.

Underlying Knowledge Forming Basis of the Present Disclosure

Before describing embodiments of the present disclosure, newly acquired findings will be presented. The following description is provided for facilitating understanding of the present disclosure and is not intended to limit the present disclosure.

The present inventors conceived a novel method for recording data in a memory cell array by making use of the difference of whether memory cells are each in an initial state or a variable state. This method differs from a traditional method of recording data utilizing the magnitude of the resistance values of memory cells in the variable state.

The novel method may be used for recording data to be kept confidential, for example. Data to be kept confidential may be data specific to a device or random number data, for example. Such data may be generated on command from a user, generated utilizing distribution of resistance values among memory cells, generated utilizing the phenomenon of probabilistic transition of a memory cell from the initial state to the variable state, or generated utilizing the phenomenon of temporal variation of the resistance value of a memory cell, for example.

Data recorded by the novel method is read based on a first threshold that is set between an initial resistance range, within which a resistance value of a memory cell in the initial state is, and a variable resistance range, within which a resistance value or a memory cell in the variable range is.

However, a memory cell set in the variable state may be erroneously determined to be in the initial state at the time of reading when its resistance value is close to the first threshold. Even if the memory cell is correctly determined to be in the variable state, its resistance value may subsequently vary over time and fall into the range of resistance values for the initial state.

A second threshold which is set within a variable resistance range for reading data recorded by a conventional method differs from the first threshold described above. If data recorded by the novel method is read correctly based on the second threshold, the confidentiality of the data would be lost. If data recorded by the novel method is not read based on the second threshold, the confidentiality of the data is improved.

For alleviation of the problem, the inventors made the present disclosure after studying a method for making the resistance values of memory cells converge to a first resistance range. For example, the resistance value of a memory cell is adjusted to fall between an upper and lower limit of the first resistance range. A certain margin may be set between the upper limit and the first threshold, or the upper limit may equate with the first threshold. A certain margin may be set between the lower limit and the second threshold, or the lower limit may equate with the second threshold.

Data to be recorded by the data recording method of the present disclosure may be either generated in a non-volatile storage device or input from outside the non-volatile storage device. The data does not have to be data to be kept confidential but can be any data.

Embodiments of the present disclosure will now be described with reference to the accompanying drawings.

The embodiments described below all show specific examples. The numerical values, shapes, materials, electrical characteristics, waveforms, components, arrangement positions and connection forms of components, steps, and the order of steps shown in the embodiments are merely examples and do not limit the present disclosure. A component that is described in an embodiment and not set forth in an independent claim showing a broadest concept of the present disclosure is described as an optional component. Description on elements given the same reference character in drawings may sometimes be omitted. Also, the drawings schematically illustrate components for the sake of clarity; shape, dimensional ratio, and the like may not be correct indications. In a manufacturing method, the order of steps and the like may be modified as desired and other known steps may be added.

Embodiments

A data recording method according to an illustrative embodiment of the present disclosure is a method for recording data in a non-volatile memory having a memory cell array in which multiple memory cells are arranged in an array.

Each of the memory cells has characteristics that can take a variable state and an initial state.

When multiple different electric signals are applied to a memory cell in the variable state, its resistance value transitions between a first resistance range and a second resistance range non-volatilely and reversibly. The first resistance range and the second resistance range are included variable resistance ranges and do not overlap each other.

A memory cell in the initial state does not transition to the variable state unless forming stress, which is electrical stress that causes a transition to the variable state, is applied to it. The resistance value of a memory cell in the initial state is within an initial resistance range. The initial resistance range does not overlap the variable resistance ranges.

The first resistance range lies between the initial resistance range and the second resistance range. A first reference value is set within the first resistance range. A second reference value is smaller than the first reference value and set within the first resistance range.

The data recording method in the illustrative embodiment includes step A and step B.

In step A, a memory cell to be changed into the variable state is selected from among memory cells in the initial state, and forming stress is applied to the memory cell.

In step B, the resistance value of the memory cell to which forming stress has been applied is set within the first resistance range. More specifically, when the resistance value of the memory cell is greater than the first reference value, a first correction signal is applied to the memory cell so as to decrease the resistance value of the memory cell. When the resistance value of the memory cell is smaller than the second reference value, a second correction signal is applied to the memory cell so as to increase the resistance value of the memory cell.

Through steps A and B, data is recorded in the memory cell array by making use of the difference of whether the memory cells are each in the initial state or the variable state.

The number of memory cells to which forming stress is applied in step A may be at least one. The number of memory cells whose resistance value is set within the first resistance range in step B may be at least one. The number of memory cells whose resistance value is set within the first resistance range in step B may be smaller than the number of memory cells to which forming stress is applied in step A. In other words, not all of the memory cells to which forming stress has been applied may be set within the first resistance range. At least one memory cell whose resistance value has changed from the initial resistance range to the first resistance range through steps A and B may be included in multiple memory cells where the data is recorded.

A memory cell in the variable state may have characteristics that cause its resistance value to transition from the second resistance range to the first resistance range in response to application of a first electric signal and from the first resistance range to the second resistance range in response to application of a second electric signal. The first resistance range may be lower than the initial resistance range, and the second resistance range may be lower than the first resistance range.

The first correction signal may include a first correction voltage pulse that has the same polarity as the second electric signal. In step B, steps C and D described below may be repeated. In step C, whether the resistance value of the memory cell to which forming stress has been applied is equal to or smaller than the first reference value is determined. If the resistance value of the memory cell is greater than the first reference value, then the first correction signal is applied to the memory cell in step D. Here, a longer pulse width may be set for the first correction voltage pulse to be applied to the memory cell in step D as the number of times the resistance value of the memory cell is determined to be greater than the first reference value as per step C increases.

The second correction signal may include a second correction voltage pulse that has the same polarity as the first electric signal. In step B, steps C and D described below may be repeated. In step C, whether the resistance value of the memory cell to which forming stress has been applied is equal to or greater than the second reference value is determined. If the resistance value of the memory cell is smaller than the second reference value, then the second correction signal is applied to the memory cell in step D. Here, a longer pulse width may be set for the second correction voltage pulse to be applied to the memory cell in step D as the number of times the resistance value of the memory cell is determined to be smaller than the second reference value as per step C increases.

The data recording method may further include a step of applying an additional electrical stress to the memory cell after step A but before step B. For example, after step A but before step B, the data recording method may include step E of setting the resistance value of the memory cell to which forming stress has been applied within the second resistance range. After step E but before step B, the data recording method may further include step F of applying an electric signal to the memory cell whose resistance value has been set within the second resistance range. The electric signal may be weaker than the first electric signal and has the same polarity as the first electric signal. In the present disclosure, this electric signal may be referred to as a "preliminary electric signal".

The non-volatile storage device according to the illustrative embodiment includes a memory cell array in which multiple memory cells are arranged in an array, and a voltage application circuit. The memory cell array is an example of a non-volatile memory.

Each of the memory cells has characteristics that can take a variable state and an initial state.

The first resistance range lies between the initial resistance range and the second resistance range. The first reference value is set within the first resistance range. The second reference value is smaller than the first reference value and set within the first resistance range.

The voltage application circuit selects a memory cell to be changed into the variable state from among memory cells in the initial state, and applies forming stress to the memory cell. The voltage application circuit then sets the resistance value of the memory cell to which forming stress has been applied within the first resistance range. More specifically, when the resistance value of the memory cell to which forming stress has been applied is greater than the first reference value, the voltage application circuit applies the first correction signal to the memory cell so as to decrease its resistance. When the resistance value of the memory cell to which forming stress has been applied is smaller than the second reference value, the voltage application circuit applies the second correction signal to the memory cell so as to increase its resistance. In this way, data is recorded in the memory cell array by making use of the difference of whether memory cells are each in the initial state or the variable state.

A memory cell in the variable state may have characteristics that cause its resistance value to transition from the second resistance range to the first resistance range in response to application of a first electric signal and from the first resistance range to the second resistance range in response to application of a second electric signal. The first resistance range may be lower than the initial resistance range, and the second resistance range may be lower than the first resistance range.

The first correction signal may include a first correction voltage pulse that has the same polarity as the second electric signal. The voltage application circuit may repeat determination of whether the resistance value of the memory cell to which forming stress has been applied is equal to or smaller than the first reference value and application of the first correction signal to the memory cell if the resistance value of the memory cell is greater than the first reference value. Here, the voltage application circuit may set a longer pulse width for the first correction voltage pulse to be applied to the memory cell as the number of times the resistance value of the memory cell is determined to be greater than the first reference value increases.

The second correction signal may include a second correction voltage pulse that has the same polarity as the first electric signal. The voltage application circuit may repeat determination of whether the resistance value of the memory cell to which forming stress has been applied is equal to or greater than the second reference value and application of the second correction signal to the memory cell if the resistance value of the memory cell is smaller than the second reference value. Here, the voltage application circuit may set a longer pulse width for the second correction voltage pulse to be applied to the memory cell as the number of times the resistance value of the memory cell is determined to be smaller than the second reference value increases.

The voltage application circuit may set the resistance value of the memory cell within the second resistance range after applying forming stress to the memory cell but before setting the resistance value of the memory cell within the first resistance range. The voltage application circuit may further apply an electric signal to the memory cell after setting the resistance value of the memory cell within the second resistance range but before setting the resistance value of the memory cell within the first resistance range. The electric signal may be weaker than the first electric signal, and has the same polarity as the first electric signal.

In the non-volatile storage device and the data recording method, the first correction signal may include a first correction voltage pulse and a first electric signal to be applied after the first correction voltage pulse.

In the non-volatile storage device and the data recording method, the second correction signal may include a second electric signal and a second correction voltage pulse to be applied after the second electric signal.

The illustrative embodiment can provide a novel method for recording data in a non-volatile memory. For example, for improving the reliability of data recording when recording data using memory cells in the initial state and memory cells in the variable state, the resistance value of a memory cell in the variable state is made to converge into the first resistance range so that the resistance value is separated from the initial resistance range and the second resistance range.

[Device Configuration]

Figure 2:
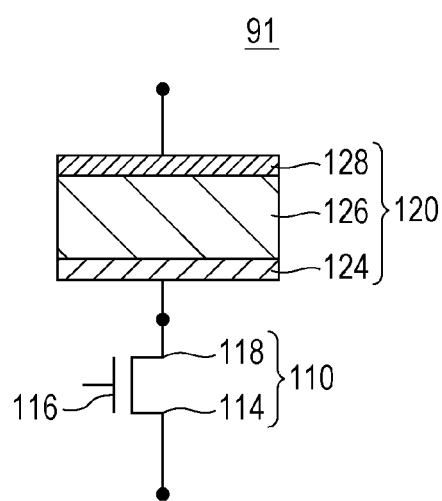
FIG. 2 schematically illustrates an exemplary structure of a memory cell included in a data generation device according to an embodiment.

FIG. 1 is a block diagram showing an exemplary configuration of the non-volatile storage device according to the illustrative embodiment. FIG. 2 schematically illustrates an exemplary structure of a memory cell included in a data generation device according to the illustrative embodiment.

In the example shown in FIG. 1, a non-volatile storage device 100 includes a memory cell array 90 and a voltage application circuit 94. The non-volatile storage device 100 is a variable-resistance-type storage device.

The memory cell array 90 is formed from multiple memory cells 91 arranged in an array. In the memory cell array 90, data can be recorded by making use of the difference of whether the memory cells 91 are in the initial state or the variable state.

In the example shown in FIG. 2, the memory cells 91 include a transistor 110 and a variable resistance element 120.

The transistor 110 has a first main terminal 114, a second main terminal 118, and a control terminal 116. The transistor 110 may be an NMOS transistor, for example, in which case one of the first main terminal 114 and the second main terminal 118 is a drain terminal and the other is a source terminal. The control terminal 116 is a gate terminal. The variable resistance element 120 includes a first electrode 124, a variable resistance layer 126, and a second electrode 128. The transistor 110 and the variable resistance element 120 are connected with each other in series by the second main terminal 118 of the transistor 110 being connected with the first electrode 124 of the variable resistance element 120.

In present disclosure, the memory cell may omit the transistor. The memory cell may include elements other than transistors or include only a variable resistance element, for example. In the present disclosure, when the memory cell includes a variable resistance element and other elements, the resistance values of the other elements may be neglected for the sake of simplicity.

Each of the memory cells 91 has characteristics that can assume a variable state and an initial state.

Figure 3:
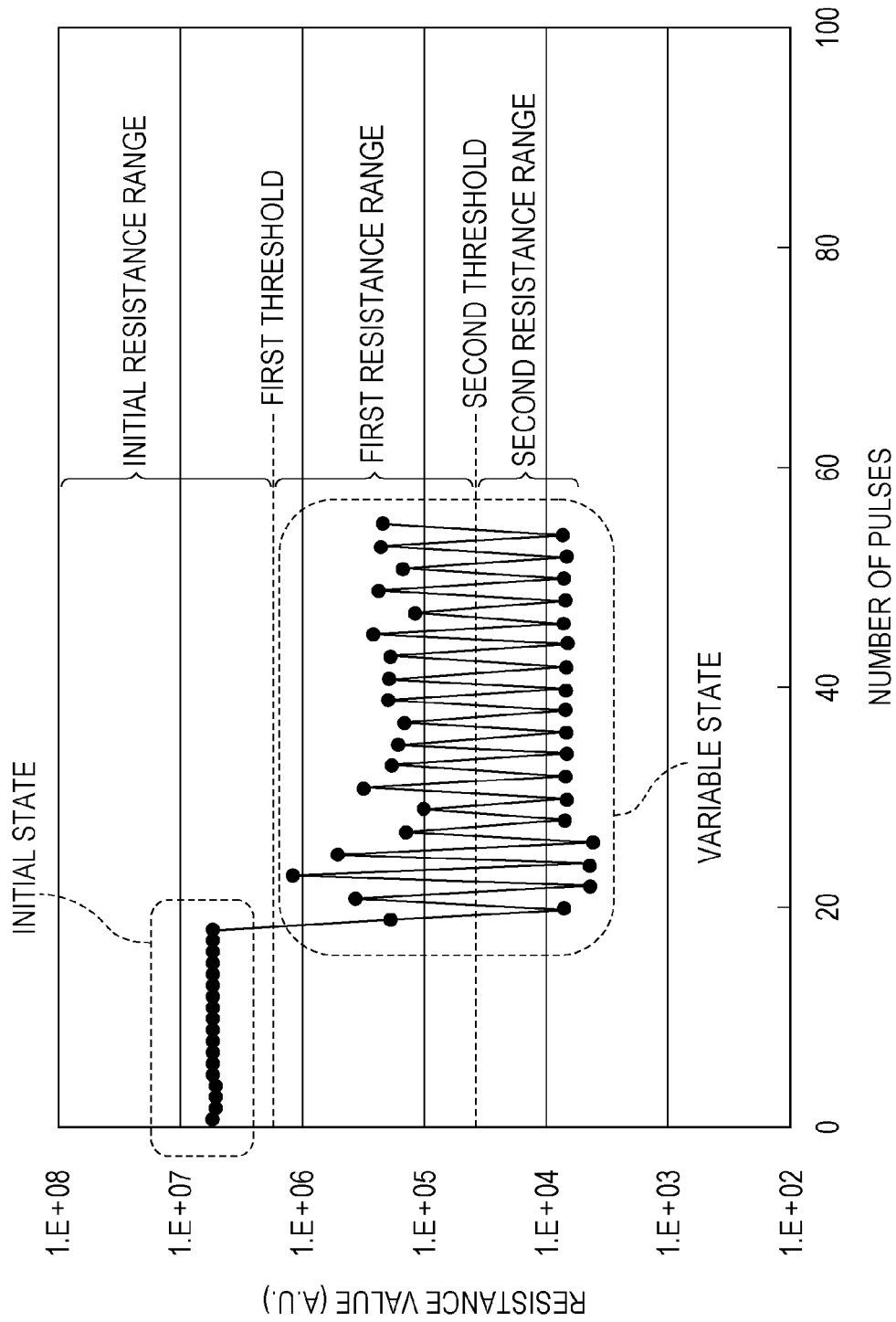
FIG. 3 shows an example of the resistance ranges of a memory cell included in a data generation device according to an embodiment.

FIG. 3 shows an example of the resistance ranges of a memory cell. As illustrated in FIG. 3, the memory cell 91 selectively takes at least two states, a variable state and an initial state.

The variable state is a state in which the resistance value of the memory cell transitions non-volatilely and reversibly between the first resistance range and the second resistance range in response to application of multiple different electric signals. The first resistance range and the second resistance range do not overlap each other.

The initial state is a state that does not transition to the variable state unless forming stress which is electrical stress that causes a transition to the variable state is applied and in which the resistance value is within the initial resistance range. The initial resistance range does not overlap either the first resistance range or the second resistance range. The forming stress may be cumulative stress, for example. Then, a memory cell in the initial state transitions to the variable state when the amount of accumulated stress has exceeded a predetermined amount. The forming stress may be any electrical stress that can cause most of memory cells in the initial state to transition to the variable state. In other words, a small number of memory cells may remain in the initial state when forming stress is applied to a large number of memory cells in the initial state.

The memory cells 91 may include memory cells in the variable state and memory cells in the initial state.

The memory cells 91 remain in the initial state until they undergo a forming process after manufacture. The forming process refers to applying a predetermined electrical stress to a memory cell to cause it to transition to the variable state. The electrical stress applied for forming may be an electric pulse having predetermined voltage and time width or a combination of multiple electric pulses, for example.

The initial resistance range and the variable resistance range may be set such that the resistance values of memory cells 91 immediately after manufacture is within the initial resistance range but not in the variable resistance range. The initial resistance range and the variable resistance range may be set such that the resistance values of memory cells 91 after a transition to the variable state is within the variable resistance range but not within the initial resistance range. A memory cell including a variable resistance element typically can have these characteristics. Memory cells 91 having such characteristics can be fabricated from various materials.

The initial state includes a state in which a memory cell 91 has undergone some kind of electrical stress other than forming stress. For example, when a memory cell 91 immediately after manufacture undergoes some kind of electrical stress that is not forming stress and its resistance value changes within the initial resistance range, this state is included in the initial state.

In the present disclosure, an initial state that has not experienced application of electrical stress yet may be called a "first initial state". An initial state that has experienced application of electrical stress may be called a "second initial state". Electrical stress to cause a memory cell 91 to transition from the first initial state to the second initial state may be larger than the electrical stress that is applied when resistance information is read from the memory cell 91 and also may be smaller than the forming stress.

The resistance information is information about a physical quantity that is correlated with the resistance. The resistance information may be the resistance value itself or a value that increases and decreases with the resistance. Examples of a value that increases or decreases with the resistance include the discharge duration of a capacitor connected in series or in parallel with a memory cell, or a count value corresponding to the discharge duration. The capacitor is not limited to being an element but may be a parasitic capacitance in wiring, for example.

The memory cells 91 are all in the first initial state immediately after they are manufactured, for example.

The resistance value of a memory cell 91 in the first initial state may be higher than the resistance value of a memory cell 91 in the second initial state.

The first resistance range lies between the initial resistance range and the second resistance range. The first reference value is set within the first resistance range. The second reference value is set within the first resistance range. The second reference value is smaller than the first reference value. The first reference value may be a value separated from the upper limit of the first resistance range and the second reference value may be a value separated from the lower limit of the first resistance range. In this case, the resistance value can converge to a range narrower than the first resistance range.

Multiple variable resistance ranges may be lower than the initial resistance range and a second resistance range that does not overlap the first resistance range. The second resistance range may be lower than the first resistance range.

The voltage application circuit 94 applies forming stress to memory cells to be changed into the variable state, the memory cells selected from among memory cells in the initial state. Memory cells to be changed into the variable state may be memory cells whose resistance values are to be set within the first resistance range.

When the resistance value of a memory cell to which forming stress has been applied is greater than the first reference value, the voltage application circuit 94 applies the first correction signal to the memory cell so as to decrease the resistance value of the memory cell. When the resistance value of a memory cell to which forming stress has been applied is smaller than the second reference value, the voltage application circuit 94 applies the second correction signal to the memory cell so as to increase the resistance value of the memory cell.

In a case in which forming stress is applied to multiple memory cells, determination using the reference values may not be performed for all of the multiple memory cells to which forming stress has been applied. The determination may be made for memory cells whose resistance values are to be set within the first resistance range among the multiple memory cells to which forming stress has been applied.

Through these operations, the voltage application circuit 94 sets the resistance value of the memory cell to which forming stress has been applied within the first resistance range. In this way, data is recorded in the memory cell array by making use of the difference of whether memory cells are each in the initial state or the variable state.

A memory cell 91 in the variable state may have characteristics that cause its resistance value to transition from the second resistance range to the first resistance range in response to application of the first electric signal and from the first resistance range to the second resistance range in response to application of the second electric signal.

The first correction signal may include a first correction voltage pulse having the same polarity as the second electric signal. In this case, the voltage application circuit 94 may repeat a cycle including (i) determining whether the resistance value of a memory cell to which forming stress has been applied is equal to or smaller than the first reference value and (ii) applying the first correction signal to the memory cell if the resistance value of the memory cell is greater than the first reference value. In the cycle of the repetition, the pulse width of the first correction voltage pulse to be applied to the memory cell may be increased as the number of times the resistance value of the memory cell is determined to be greater than the first reference value increases.

The second correction signal may include a second correction voltage pulse having the same polarity as the first electric signal. In this case, the voltage application circuit 94 may repeat a cycle including (i) determining whether the resistance value of the memory cell to which forming stress has been applied is equal to or greater than the second reference value and (ii) applying the second correction signal to the memory cell if the resistance value of the memory cell is smaller than the second reference value. In the cycle of the repetition, the pulse width of the second correction voltage pulse to be applied to the memory cell may be increased as the number of times the resistance value of the memory cell is determined to be smaller than the second reference value increases.

The operation of increasing the pulse width of the first correction voltage pulse and the operation of increasing the pulse width of the second correction voltage pulse may be performed in combination.

The voltage application circuit 94 may set the resistance value of a memory cell to be changed into the variable state within the second resistance range after applying forming stress to the memory cell but before setting the resistance value of the memory cell within the first resistance range. In such an implementation, the voltage application circuit 94 may further apply an electric signal weaker than the first electric signal and having the same polarity as the first electric signal to the memory cell, after setting the resistance value of the memory cell within the second resistance range but before setting the resistance value of the memory cell within the first resistance range.

The first correction signal may include a first correction voltage pulse and a first voltage pulse to be applied after the first correction voltage pulse. The second correction signal may include a second voltage pulse and a second correction voltage pulse to be applied after the second electric signal. The first voltage pulse has the same polarity as the first electric signal, for example. The first voltage pulse may have the same voltage value and pulse width as the first electric signal. The second voltage pulse has the same polarity as the second electric signal, for example. The second voltage pulse may have the same voltage value and pulse width as the second electric signal, for example.

The first correction signal may be any electrical stress that at least decreases the resistance value of a memory cell and may be different from the electrical stress described in the exemplary embodiments discussed later. The second correction signal may be any electrical stress that at least increases the resistance value of a memory cell and may be different from the electrical stress described in the exemplary embodiments discussed later.

The illustrative embodiment can provide a novel method for recording data in a non-volatile memory. For example, when data is recorded using a memory cell in the initial state and a memory cell in the variable state, the resistance value of the memory cell in the variable state converges to the first resistance range. As a result, the resistance value of the memory cell in the variable state is separated from the initial resistance range and the second resistance range, improving the reliability of the written data.

A variable resistance element that exhibited the resistance characteristics shown in FIG. 3 had the following constitution. The material of the first electrode 124 was tantalum nitride (TaN) and that of the second electrode 128 was iridium (Ir). The material of the variable resistance layer 126 was tantalum oxide, and the total thickness thereof was 50 nm or less. The variable resistance layer 126 had a laminated structure formed from two layers with different oxygen concentrations, e.g., a first variable resistance layer and a second variable resistance layer. The first variable resistance layer was in contact with the first electrode 124, while the second variable resistance layer was in contact with the second electrode 128. The composition of the first variable resistance layer was $TaO_x$ (where x satisfies 0<x<2.5). The composition of the first variable resistance layer was $TaO_y$ (where y satisfies y≥2.1). The thickness of the second variable resistance layer was about 5.5 nm. The area of contact between the first electrode 124 and the variable resistance layer 126 and the area of contact between the second electrode 128 and the variable resistance layer 126 were both 0.25 $\mu m^2$ or less. Forming stress was composed of multiple pulses. Each of the pulses had a voltage of +3.5 V and a pulse width of 5 μsec.

The second electric signal was a pulse having a voltage of −2.4 V and a pulse width of 50 nsec. The first electric signal was a pulse having a voltage of +1.8 V and a pulse width of 50 nsec. In the memory cell structure shown in FIG. 2, the polarity of voltage was assumed to be positive when positive voltage was applied to the second electrode 128 with reference to the first electrode 124.

As alternatives, the first electrode 124 and the second electrode 128 may be also formed from platinum (Pt), and the variable resistance layer 126 may be formed from hafnium oxide. The thickness of the variable resistance layer 126 may be 30 nm, for example. The shape of the element region may be a circle 3 μm in diameter. In a case in which the variable resistance layer 126 is formed from $HfO_{1.6}$, the initial resistance value may be several MΩ, the first resistance range may be from 1000 Ω to 3000 Ω inclusive, and the second resistance range may be from 100 Ω to 300 Ω inclusive. Forming stress then may be multiple pulses having voltages of 2 to 3 V and a pulse width of 100 nsec, for example. The second electric signal may be a pulse with a voltage of +1.0 V and a pulse width of 100 nsec, and the first electric signal may be a pulse with a voltage of −1.3 V and a pulse width of 100 nsec.

In the example shown in FIG. 3, the lower limit of the initial resistance range is equal to or greater than the upper limits of all of the variable resistance ranges. In other words, the lower limit of the initial resistance range is equal to or greater than the upper limit of the highest variable resistance range. For example, the lower limit of the initial resistance range may be equal to the upper limit of the first resistance range.

In the example shown in FIG. 3, the first threshold is equal to or smaller than the lower limit of the initial resistance range and equal to or greater than the upper limits of all of the variable resistance ranges. In other words, the first threshold is equal to or smaller than the lower limit of the initial resistance range and equal to or greater than the upper limit of the highest variable resistance range. For example, the first threshold may be equal to the upper limit of the first resistance range. A resistance value having a value equal to the first threshold may be set as a value belonging to the initial resistance range or to the highest variable resistance range.

In the example shown in FIG. 3, the second threshold is equal to or smaller than the lower limit of the highest variable resistance range and equal to or greater than the upper limit of the lowest variable resistance range. For example, the second threshold may be a value that is equal to or smaller than the lower limit of the first resistance range and equal to or greater than the upper limit of the second resistance range. For example, the second threshold may be equal to the lower limit of the first resistance range or the upper limit of the second resistance range. The first resistance range and the second resistance range may adjoin each other. That is, the smaller one of the values representing the two end points defining the first resistance range may agree with the greater one of the values representing the two end points defining the second resistance range. A resistance value that is equal to the second threshold may be set as a value belonging to a resistance range including resistance values greater than the second threshold or to a resistance range including resistance values smaller than the second threshold.

The first threshold may be equal to or greater than the upper limit of the initial resistance range and equal to or smaller than the lower limits of all of the variable resistance ranges. In other words, the first threshold may be equal to or greater than the upper limit of the initial resistance range and equal to or smaller than the lower limit of the lowest variable resistance range. For example, the first threshold may be equal to the lower limit of the second resistance range.

The second threshold may be equal to or greater than the upper limit of one of multiple variable resistance ranges that has the lowest resistance value and equal to or smaller than the lower limit of the highest variable resistance range. For example, the second threshold may be equal to or greater than the upper limit of the second resistance range and equal to or smaller than the lower limit of the first resistance range. For example, the second threshold may be equal to the lower limit of the first resistance range and the upper limit of the second resistance range.

The upper limit and the lower limit of neighboring resistance ranges may not adjoin each other. A certain margin may be set between neighboring resistance ranges.

While two variable resistance ranges are present in the example shown in FIG. 3, there may be three or more variable resistance ranges.

For example, for the variable resistance element shown in FIG. 3, the initial resistance range may be set to from $2\times10^6$ Ω to less than $1.0\times10^7$ Ω, and the two variable resistance ranges may respectively be set to from $5\times10^4$ Ω to less than $2\times10^6$ Ω and from $5\times10^3$ Ω to less than $5\times10^4$ Ω. Then, the first threshold may be $2\times10^6$ Ω and the second threshold may be $5\times10^4$ Ω, for example.

[Structure of Variable Resistance Element]

In the example shown in FIG. 2, the variable resistance layer 126 is present between the first electrode 124 and the second electrode 128. The variable resistance layer 126 may be formed from a metal oxide, for example, and more specifically, a transition metal oxide, for example. The resistance value of the variable resistance element 120 in the variable state has the characteristic of transitioning between multiple variable resistance ranges non-volatilely and reversibly in response to an electric signal applied between the first electrode 124 and the second electrode 128.

The variable resistance layer 126 of the variable resistance element 120 in the initial state may insulate between the first electrode 124 and the second electrode 128. Insulation means that the resistance between the first electrode 124 and the second electrode 128 is $2\times10^6$ Ω or higher, for example. The variable resistance layer 126 of the variable resistance element 120 may include a layer composed of insulator. Insulator means a material having a resistivity of at least 30 Ω·m, for example. Forming at least part of the variable resistance layer 126 of the variable resistance element 120 from insulator can stably retain the resistance characteristics in the initial state.

Unlike in the variable state, the resistance value of the variable resistance element 120 in the initial state can be adjusted to a certain degree with the material, size, shape, and manufacturing conditions of the variable resistance element. Particularly when the variable resistance layer 126 has a laminated structure, its resistance value can be adjusted as desired with the thickness of a high oxygen concentration layer and/or the oxygen concentration during fabrication.

Having such characteristics, the initial state is more stable than the variable state in which the resistance value varies with application of electric signals. Thus, data can be stably maintained by making use of the difference between the initial state and the variable state.

Electrical stress for reading is smaller than both forming stress and the electric signal for causing the resistance value of the variable resistance element in the variable state to change between multiple variable resistance ranges.

The forming stress is typically stronger than the electric signal for causing the resistance value of the variable resistance element 120 in the variable state to reversibly change between multiple variable resistance ranges. For example, the forming stress may be greater than the electric signal for changing the resistance value of the variable resistance element 120 in the variable state in at least one of the absolute value of voltage, pulse width, and cumulative application time. The cumulative application time represents the total pulse width of electric pulses that are applied during a change of the resistance state from the initial state to the variable state, for example.

The variable resistance element 120 may be a unipolar element. When in the variable state, the resistance value of a unipolar variable-resistance element reversibly changes in response to application of multiple electric signals having different voltages and pulse widths and having the same polarity. By way of example, the resistance value of a unipolar variable-resistance element changes to a value in the first resistance range upon application of a first electric signal with a voltage of +2 V and a pulse width of 1 μsec, and to a value in the second resistance range upon application of a second electric signal with a voltage of −4 V and a pulse width of 50 nsec. Here, for the polarity of the voltage of electric signals, the direction in which current flows from the second electrode 128 to the first electrode 124 is assumed to be positive.

The variable resistance element 120 may also be a bipolar element. The resistance value of a bipolar variable-resistance element 120 in the variable state reversibly changes in response to application of electric signals of different polarities. By way of example, the resistance value of a bipolar variable-resistance element changes to a value in the first resistance range upon application of a first electric signal with a voltage of +2 V and a pulse width of 50 nsec and to a value in the second resistance range upon application of a second electric signal with a voltage of −2 V and a pulse width of 50 nsec. Here, for the polarity of the voltage of electric signals, the direction in which current flows from the second electrode 128 to the first electrode 124 is assumed to be positive.

For a bipolar variable-resistance element 120, the first electric signal and the second electric signal may be different in pulse width and/or voltage absolute value in order to stabilize the operation, for example.

The variable resistance layer 126 may be formed from a metal oxide. The variable resistance layer 126 may include a layer formed from an oxygen deficient metal oxide. The metal oxide forming the variable resistance layer 126 may be at least one of a transition metal oxide and aluminum oxide. The transition metal oxide may be at least one of tantalum oxide, iron oxide, hafnium oxide, and zirconium oxide, for example.

With a variable resistance layer made of tantalum oxide, the variable resistance element will exhibit excellent characteristics.

The first electrode 124 and the second electrode 128 may be made of materials such as iridium (Ir), platinum (Pt), tungsten (W), copper (Cu), aluminum (Al), titanium nitride (TiN), tantalum nitride (TaN), and titanium aluminum nitride (TiAlN). Although the first electrode 124 and the second electrode 128 are illustrated as having equal areas in the example shown in FIG. 2, this is not a limitation. For example, the first electrode 124 may be a part of wiring. The first electrode 124 and the second electrode 128 may be formed in optimal shapes in accordance with the semiconductor process. An underlayer (not shown) may be omitted or modified in accordance with the semiconductor process.

The variable resistance layer 126 may be a laminate including a first variable resistance layer connected with the first electrode 124 and a second variable resistance layer connected with the second electrode 128.

The first variable resistance layer may be formed from an oxygen-deficient first metal oxide, while the second variable resistance layer may be formed from a second metal oxide with lower oxygen deficiency than the first metal oxide. The second variable resistance layer may be a layer formed from insulator. For example, in the second variable resistance layer of the variable resistance element in the variable state, a minute local region with oxygen deficiency varying reversibly in response to application of an electric pulse is formed. The local region may also be an electrically conductive path penetrating through the second variable resistance layer. The local region will contain filaments formed of oxygen defect sites. If the second variable resistance layer is an insulator composed of a metal oxide, the electrically conductive path may be composed of an oxygen deficient metal oxide having a lower oxygen content ratio than the insulator.

The oxygen deficiency means the ratio of the deficient amount of oxygen contained in a certain metal oxide to the amount of oxygen contained in a stoichiometric metal oxide which consists of the same element as the certain metal oxide, where the deficient amount is an amount by subtracting the amount of oxygen contained in the certain metal oxide from that in the stoichiometric metal oxide. In a case in which multiple stoichiometric compositions exist as oxides of a certain kind of metal, the oxygen deficiency of an oxide of the metal is defined with reference to the stoichiometric composition that has the highest resistance. A metal oxide of a stoichiometric composition is more stable and has a higher resistance than a metal oxide of other composition.

As an example, when the metal contained in a metal oxide is tantalum (Ta), the oxide of a stoichiometric composition by the aforementioned definition is $Ta_2O_5$ and can be represented as $TaO_{2.5}$. For example, the oxygen deficiency of $TaO_{2.5}$ is 0%, while the oxygen deficiency of $TaO_{1.5}$ is $(2.5-1.5)/2.5=40\%$. The oxygen deficiency of an oxygen-excess metal oxide is a negative value. In the present disclosure, oxygen deficiency is described as including a positive value, 0, and a negative value unless otherwise specified.

An oxygen deficient metal oxide with a lower oxygen deficiency is closer to a metal oxide of a stoichiometric composition and hence has a higher resistance value. An oxygen deficient metal oxide with a higher oxygen deficiency is closer to the metal contained in that metal oxide and hence has a lower resistance value.

The oxygen content ratio refers to the proportion of oxygen atoms to the total number of atoms. For example, the oxygen content ratio of $Ta_2O_5$ is the proportion of oxygen atoms to the total number of atoms, $(O/(Ta+O))$, which is 71.4 atm %. Accordingly, the oxygen content ratio of an oxygen deficient tantalum oxide is greater than 0 and smaller than 71.4 atm %. For instance, in a case in which the metal constituting a first metal oxide and the metal constituting a second metal oxide are of the same kind, the oxygen content ratio is related to the oxygen deficiency. That is, when the oxygen content ratio of the second metal oxide is higher than the oxygen content ratio of the first metal oxide, the oxygen deficiency of the second metal oxide is lower than the oxygen deficiency of the first metal oxide.

The metal contained in the metal oxide forming the variable resistance layer may be a metal other than tantalum. The metal may be at least one of a transition metal and aluminum (Al), for example. Examples of transition metals include tantalum (Ta), titanium (Ti), hafnium (Hf), zirconium (Zr), niobium (Nb), tungsten (W), nickel (Ni), and iron (Fe). Since a transition metal can assume multiple oxidation states, it can change into multiple different resistance states through redox reaction.

For example, the variable resistance layer 126 may be formed from hafnium oxide, in which case the composition of the first metal oxide may be $HfO_x$ (where x is from 0.9 to 1.6 inclusive) and the composition of the second metal oxide may be $HfO_y$ (where x, y satisfy x<y), for example. This allows the resistance value of the variable resistance layer to vary stably and fast. For example, the thickness of the second metal oxide may be from 3 nm to 4 nm inclusive.

The variable resistance layer 126 may be formed from zirconium oxide, for example, in which case the composition of the first metal oxide may be $ZrO_x$ (where x is from 0.9 to 1.4 inclusive) and the composition of the second metal oxide may be $ZrO_y$ (where x, y satisfy x<y), for example. This allows the resistance value of the variable resistance layer to vary stably and fast. For example, the thickness of the second metal oxide may be from 1 nm to 5 nm inclusive.

The first metal constituting the first metal oxide may be the same as or different from the second metal constituting the second metal oxide, as far as the second metal oxide may have a higher resistivity than the first metal oxide. With these constitutions, when a voltage is applied between the first electrode 124 and the second electrode 128, more voltage is distributed to the second metal oxide, facilitating occurrence of redox reaction in the second metal oxide.

When the first metal oxide and the second metal oxide are composed of the same elements, the second metal oxide may have a lower oxygen deficiency than the first metal oxide. When the first metal contained in the first metal oxide may be different from the second metal contained in the second metal oxide, the standard electrode potential of the second metal may be lower than the standard electrode potential of the first metal. The standard electrode potential represents oxidation characteristics. A metal with a higher standard electrode potential is more resistant to oxidation. Thus, redox reaction is easier to occur in the second metal oxide which has a relatively lower standard electrode potential.

For example, the first metal oxide may be formed from oxygen deficient tantalum oxide ($TaO_x$) and the second metal oxide may be formed from titanium oxide ($TiO_2$). The standard electrode potential of titanium is −1.63 eV, while the standard electrode potential of tantalum is −0.6 eV. When the standard electrode potential of the second metal oxide is thus lower than the standard electrode potential of the first metal oxide, redox reaction is easier to occur in the second metal oxide. Consequently, stable resistance change actions can be obtained. As another example of combination of the first metal oxide and the second metal oxide, the second metal oxide may be aluminum oxide ($Al_2O_3$). For example, the first metal oxide may be formed from oxygen deficient tantalum oxide ($TaO_x$) and the second metal oxide may be formed from aluminum oxide ($Al_2O_3$).

The material of the second electrode 128, which is in contact with the second metal oxide, may have a higher standard electrode potential than the metal constituting the second metal oxide and the material of the first electrode 124. Examples of the material of the second electrode 128 include platinum (Pt), iridium (Ir), and palladium (Pd). The material of the first electrode 124 which is in contact with the first metal oxide may have a lower standard electrode potential than the metal constituting the first metal oxide. Examples of the material of the first electrode 124 include tungsten (W), nickel (Ni), tantalum (Ta), titanium (Ti), aluminum (Al), tantalum nitride (TaN), and titanium nitride (TiN).

To sum up, V1, V2, Vr2, and Vr1 may satisfy the relationships Vr2<V2 and V1<V2, where V2 represents the standard electrode potential of the second electrode 128, Vr2 represents the standard electrode potential of the metal constituting the second metal oxide, Vr1 represents the standard electrode potential of the metal constituting the first metal oxide, and V1 represents the standard electrode potential of the first electrode 124. V1, V2, Vr2, and Vr1 may further satisfy the relationships V2>Vr2 and Vr1≥V1. This causes selective redox reaction in the second metal oxide near the interface between the second electrode 128 and the second metal oxide. Consequently, a stable resistance change phenomenon is realized.

The variable resistance layer 126 includes a first variable resistance layer that has a composition represented by $TaO_x$ (where x satisfies 0≤x<2.5) and a second variable resistance layer that has a composition represented by $TaO_y$ (where x, y satisfies x<y<2.5), for example. The variable resistance layer 126 may include an additional layer, which may be formed from a metal oxide other than tantalum oxide, for example.

The composition of the first variable resistance layer may be $TaO_x$ (where x satisfies 0.8≤x<1.9), and the composition of the second variable resistance layer may be $TaO_y$ (where y satisfies 2.1≤y<2.5). The thickness of the second tantalum oxide layer may be from 1 nm to 8 nm inclusive, for example. Inclusion of multiple layers with different oxygen deficiencies in the variable resistance layer 126 can determine the direction of resistance change in a bipolar element. For example, imagine a structure in which the second variable resistance layer is positioned on the second electrode 128 side and the first variable resistance layer is positioned on the first electrode 124 side. Then, when a voltage is applied in a direction that causes a current to flow from the second electrode 128 side to the first electrode 124 side, the resistance value of the variable resistance element 120 increases; when a voltage is applied in a direction that causes a current to flow in the reverse direction, the resistance value of the variable resistance element 120 decreases. Alternatively, the second variable resistance layer may be in contact with the first electrode 124 and the first variable resistance layer may in contact with the second electrode 128. In this case, the relationship between resistance change and the direction of voltage application is reversed.

Resistance change in a variable resistance element in the variable state occurs in response to a change of filaments in local regions within the variable resistance layer 126. Observed through cross-sectional analysis, the sizes of the local regions were 30 nm or less in diameter, or further 10 nm or less, for example. These values are smaller than the fabrication limit of lithography in the state-of-the-art semiconductor process. That is, local regions containing filaments are less susceptible to variations between processes. Thus, even when fabricated in a small feature size, the variable resistance element can retain stable resistance change characteristics.

The variable resistance layer of a variable resistance element can be formed without going through high temperature processing at, for example, above several hundred ° C. Thus, degradation in the characteristics of C-MOS transistors caused by a heating process is avoided. Compared to memory elements using floating gate transistors such as flash memory, variable resistance elements have high compatibility with semiconductor processes. The reliability of resistance change is accordingly less likely to reduce even with a smaller feature manufacturing process. Thus, even in a case in which logic circuits such as control circuits and variable resistance elements are implemented on the same chip, the variable resistance elements can be formed with little influence on the characteristics of the logic circuits. When logic circuits and variable resistance elements are manufactured in a common process, manufacturing costs could be reduced.

A resistance change phenomenon in the variable resistance layer of a laminated structure is presumed to occur as follows. In the variable state, the layer of the second metal oxide with higher resistance has minute local regions in it. Redox reaction occurs in the local regions to cause a change in filaments, or electrically conductive paths, present in the local regions. This results in a change of the resistance values of the local regions.

For example, when a positive voltage referenced to the first electrode 124 is applied to the second electrode 128 connected with the second metal oxide, oxygen ions in the variable resistance layer are attracted toward the second metal oxide side. This causes oxidation reaction to occur in the minute local regions in the second metal oxide to reduce the oxygen deficiency in the local regions. As a result, the number or thickness of filaments in the local regions decreases and the resistance increases.

Conversely, when a negative voltage referenced to the first electrode 124 is applied to the second electrode 128 connected with the second metal oxide, oxygen ions in the second metal oxide are pushed toward the first metal oxide side. This causes reduction reaction to occur in the minute local regions in the second metal oxide to increase the oxygen deficiency in the local regions. As a result, the number or thickness of filaments in the local regions increases and the resistance decreases.

Figure 4:
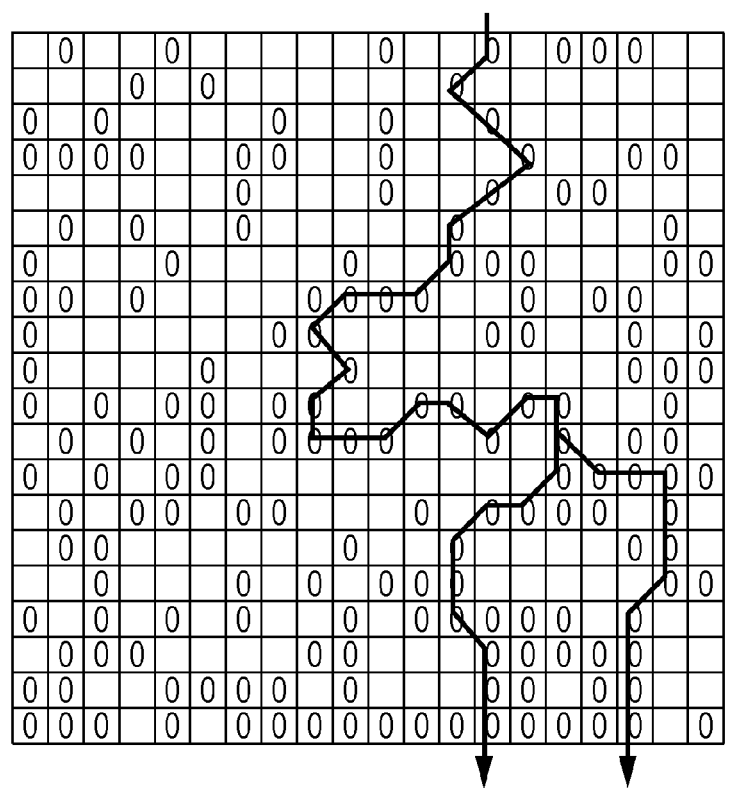
FIG. 4 shows an exemplary result of simulation of filament formation in a variable resistance layer (for example, a local region) using a percolation model.

FIG. 4 shows a result of simulation of filament formation in a variable resistance layer, e.g., a local region, using a percolation model. This example assumes that filaments are formed by connection of oxygen defect sites in the variable resistance layer. A percolation model is based on the theory that the probability of a string of defect sites being formed increases as the density of defect sites distributed randomly in the variable resistance layer increases. As used herein, the term "defect" means lack of oxygen in a metal oxide, and "the density of defect sites" is an amount that is correlated with oxygen deficiency, for example. For example, when the oxygen deficiency increases, the density of defect sites also increases.

In the simulation illustrated in FIG. 4, oxygen ion sites in the variable resistance layer are assumed to be regions or sites in a lattice formation as an approximate representation. Based on this assumption, filaments formed by defect sites that are generated probabilistically were determined by a simulation. In FIG. 4, a site including "0" represents a defect site formed in the variable resistance layer. An empty site, meanwhile, represents a site occupied by oxygen ions. A site occupied by oxygen ions means a region with high resistance. Among a cluster of defect sites adjacent to each other, the string of defect sites continuously extending between the bottom surface and the upper surface of the variable resistance layer, or the second variable resistance layer, may be referred to as a "filament". In FIG. 4, an arrow indicates the filament in which defect sites are connected to each other in the range of a single site in the vertical, horizontal, or oblique direction. The filament passes through randomly distributed defect sites. Based on this percolation model, the number and shapes of filaments are probabilistically determined. As a result, the variable resistance elements have various resistance values.

A forming process corresponds to a process for changing the density of defect sites in the metal oxide and thereby forming filaments in a partial area of the variable resistance layer. The locations of defect sites in the variable resistance layer are random and differ from one element to another. Therefore, even when an equal electrical stress is applied to multiple memory cells, the number and shapes of the resultant strings of defect sites vary among the memory cells. These variations seem to cause random distribution of resistance values among the memory cells.

The non-volatile storage device 100 may include a read circuit (not shown). The read circuit is configured to be able to read recorded data by determining whether a selected memory cell 91 is in the initial state or the variable state.

The read circuit may also read data recorded in the memory cell array 90 by selectively executing a first reading mode and a second reading mode. In the first reading mode, the read circuit reads data by determining whether the resistance value of the selected memory cell 91 is greater than the first threshold or not. In the second reading mode, the read circuit reads data by determining whether the resistance value of the selected memory cell 91 is greater than the second threshold or not.

Data recorded in the memory cell array 90 may include a first kind of data and a second kind of data. The first kind of data may be recorded by making use of the difference of whether the resistance value of each memory cell 91 is within the initial resistance range or not. The second kind of data may be recorded by making use of the difference of whether the resistance value of each memory cell is within at least one variable resistance range or not, instead of whether the resistance value of the memory cell 91 is within the initial resistance range or not.

The memory cell array 90 may have a first write address area and a second write address area. In such an implementation, the first kind of data may be recorded in the first write address area and the second kind of data may be recorded in the second write address area. The first write address area and the second write address area may or may not be physically separate areas. For example, each memory cell 91 may be designated as the first write address area or the second write address area in accordance with a predefined rule concerning address.

The second write address area is an area composed of multiple memory cells 91 in the variable state, for example. For example, the second write address area may be formed by application of forming stress to multiple memory cells 91 in the initial state. The memory cells in the initial state may be memory cells immediately after manufacture, for example. In this case, the forming stress may be used not only for recording the first kind of data but also for forming the second write address area in which to write the second kind of data.

By selective application of forming stress to the memory cells 91 constituting the memory cell array 90, the first write address area and the second write address area may be defined. Thus, allocation of capacity and/or layout of the address areas may be freely chosen. When forming stress is applied to a part of the first write address area, that part is changed to the second write address area.

The first write address area and the second write address area are located in the same memory cell array 90, for example. This can enhance the security of information when information is sent and received between the first write address area and the second write address area, for example.

In the variable resistance element shown in FIG. 3, the first kind of data is recorded by making use of the difference of whether the resistance value of each memory cell 91 is within the initial resistance range or not, and the second kind of data is recorded by making use of the difference of whether the resistance value of each memory cell 91 is within the second resistance range or not, for example.

[Data Recording Method]

Figure 5:
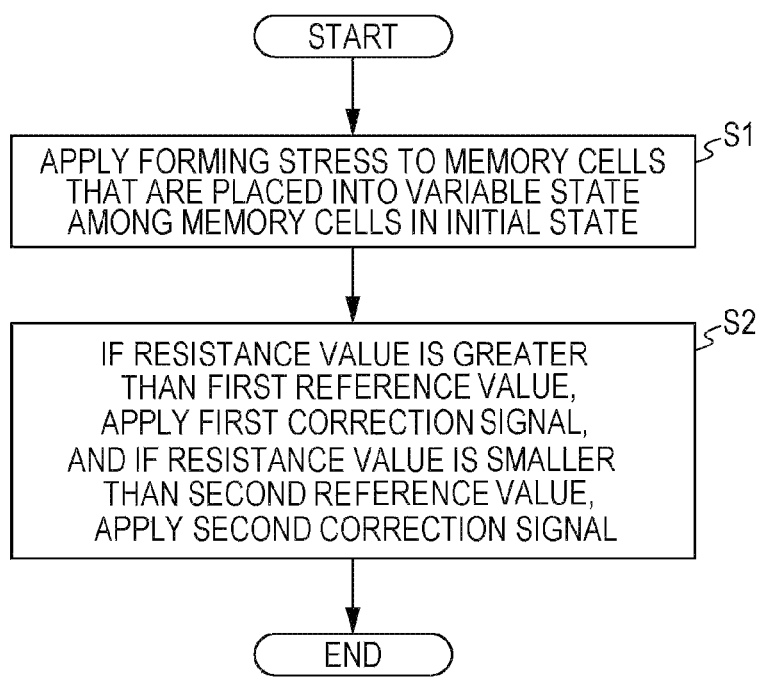
FIG. 5 is a flowchart illustrating an example of a data recording method according to an embodiment.

FIG. 5 is flowchart illustrating an example of the data recording method in the illustrative embodiment. The data recording method in the illustrative embodiment will be described below with reference to FIG. 5. The operations described below may be executed by the voltage application circuit 94, for example.

When data recording is started (START), forming stress is applied to a memory cell 91 to be changed into the variable state among memory cells 91 in the initial state (step S1). Then, if the resistance value of the memory cell 91 is greater than the first reference value, the first correction signal is applied to the memory cell 91, and if the resistance value of the memory cell 91 is smaller than the second reference value, the second correction signal is applied to the memory cell 91 (step S2). The data recording then ends (END).

As per step S2, the resistance value of the memory cell 91 to be changed into the variable state is set within the first resistance range. As per steps s1 and S2, data is recorded in the memory cell array 90 by making use of the difference of whether the memory cells 91 are each in the initial state or the variable state.

Step S2 may repeat step S3 of determining whether the resistance value of the memory cell to which forming stress has been applied is equal to or smaller than the first reference value and step S4 of applying the first correction signal to the memory cell if the resistance value of the memory cell is greater than the first reference value. Here, a longer pulse width may be set for the first correction voltage pulse to be applied to the memory cell in step S4 as the number of times the resistance value of the memory cell is determined to be greater than the first reference value in step S3 increases.

Step S2 may repeat step S5 of determining whether the resistance value of the memory cell to which forming stress has been applied is equal to or greater than the second reference value and step S6 of applying the second correction signal to the memory cell if the resistance value of the memory cell is smaller than the second reference value. Here, a longer pulse width may be set for the second correction voltage pulse to be applied to the memory cell in step S6 as the number of times the resistance value of the memory cell is determined to be smaller than the second reference value in step S5 increases.

The data recording method according to this embodiment may further include a step of applying an additional electrical stress to memory cells after step S1 but before step S2. For example, the data recording method may include step S7 of setting the resistance value of the memory cell to which forming stress has been applied within the second resistance range after step S1 but before step S2, and step S8 of applying an electric signal weaker than the first electric signal and having the same polarity as the first electric signal to the memory cell whose resistance value has been set within the second resistance range in step S7 after step S7 but before step S2. The data recording method may include a step of applying a certain electrical stress to the memory cell to stabilize the resistance characteristics of the memory cell after step S1 but before step S2, for example.

The variations described above in the Device Configuration may also be practiced as variations of the data recording method.

First Exemplary Embodiment
<Device Configuration>

Figure 6:
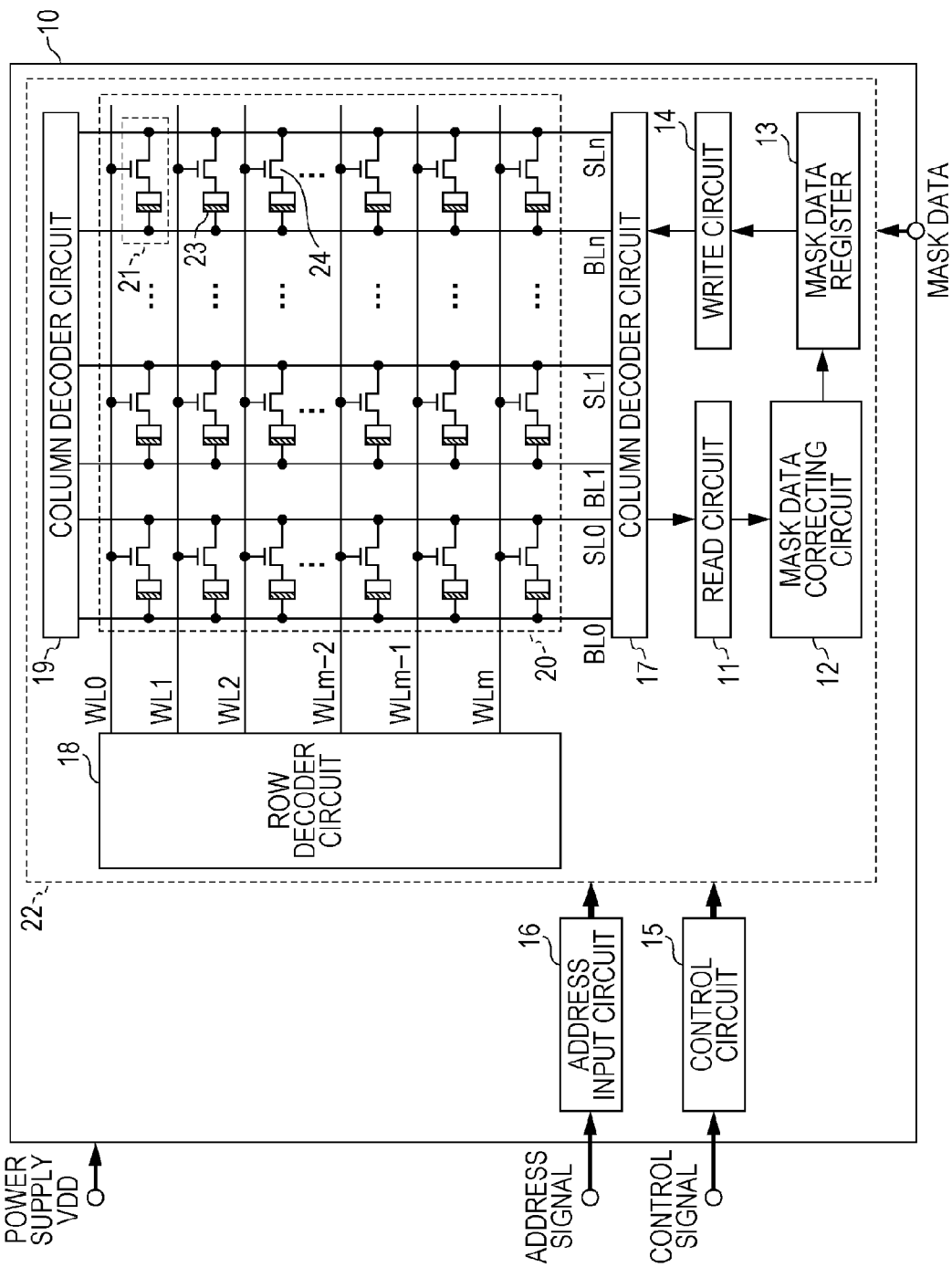
FIG. 6 is a block diagram schematically showing the configuration of the non-volatile storage device in a first exemplary embodiment.

FIG. 6 is a block diagram schematically showing the configuration of the non-volatile storage device in a first exemplary embodiment.

As illustrated in FIG. 6, a non-volatile storage device 10 in the first exemplary embodiment has a memory main body 22 on a semiconductor substrate. The memory main body 22 includes a memory cell array 20, a row decoder circuit 18, column decoder circuits 17 and 19, a write circuit 14, and a read circuit 11. The row decoder circuit 18 selects one word line WL from multiple word lines WL connected with the memory cell array 20. The column decoder circuits 17, 19 select one bit line BL and one source line SL from multiple bit lines BL and source lines SL and apply a predetermined voltage for an intended operation. The write circuit 14 writes information into a selected memory cell 21. The read circuit 11 detects the amount of current flowing in a bit line and outputs the detected value in the selected memory cell as a count value, for example.

The non-volatile storage device 10 may further include a mask data correcting circuit 12, a mask data register 13, an address input circuit 16, and a control circuit 15. The mask data correcting circuit 12 generates correction data based on the count value output from the read circuit 11. The mask data register 13 stores mask data that has been updated based on the correction data. The address input circuit 16 receives address signals input from the outside. The control circuit 15 controls the operation of the memory main body 22 in response to control signals input from the outside.

The memory cell array 20 is an example of non-volatile memory. A circuit block including the read circuit 11, the mask data correcting circuit 12, the mask data register 13, and the write circuit 14 is an example of the voltage application circuit.

The memory cell array 20 has multiple word lines WL0, WL1, WL2, . . . WLm-1, WLm, multiple bit lines BL0, BL1, . . . BLn, and multiple source lines SL0, SL1, SL2, . . . SLn. The word lines WL0, WL1, WL2, . . . WLm-1, WLm extend parallel with each other. The bit lines BL0, BL1, . . . BLn extend parallel with each other and three-dimensionally intersect the word lines WL0, WL1, WL2, . . . WLm-1, WLm. The source lines SL0, SL1, . . . SLn extend parallel with each other and three-dimensionally intersect the word lines WL0, WL1, WL2, . . . WLm-1, WLm. The source lines SL0, SL1, . . . SLn may also extend parallel with the bit lines BL0, BL1, . . . BLn. A memory cell 21 is disposed at each of the three-dimensional intersections of the word lines WL0, WL1, WL2, . . . WLm-1, WLm and the bit lines BL0, BL1, . . . BLn.

Each memory cell 21 has a variable resistance element 23 and a transistor 24. The word lines WL0, WL1, WL2, . . . WLm-1, WLm are respectively connected to the gate terminals of the transistors 24. The bit lines BL0, BL1, . . . BLn are respectively connected to the second electrodes of the variable resistance elements 23. The first electrode of the variable resistance element is connected to the second main terminal of the transistor 24. The source lines SL0, SL1, SL2, . . . SLn are respectively connected to the first main terminals of the transistors 24.

The variable resistance element 23 functions as a non-volatile storage element in the memory cell 21. In the non-volatile storage device 10, each memory cell 21 is composed of one transistor 24 and one variable resistance element 23.

When the address input circuit 16 receives an address signal, the row decoder circuit 18 selects one of the word lines WL0, WL1, WL2, . . . WLm-1, WLm, and the column decoder circuits 17, 19 select a pair of a bit line and a source line from the bit lines WL0, WL1, WL2, . . . WLm-1, WLm and the source lines SL0, SL1, SL2, . . . SLn. The memory cell 21 corresponding to the address signal is thereby selected.

When the control circuit 15 receives a control signal, one of the bit line and source line of the selected pair is selectively connected to the write circuit 14 in the case of writing or to the read circuit 11 in the case of reading via the column decoder circuit 17. The control circuit 15 then has the write circuit 14 or the read circuit 11 operate.

As the variable resistance element 23 may be configured similarly to the variable resistance element 120 described above in the illustrative embodiment, detailed description of it is omitted.

In the example shown in FIG. 6, the selection transistor in the memory cell array 20 is an NMOS transistor.

The mask data register 13 may be of any structure that is capable of holding predetermined data. The mask data register 13 may also be provided outside the non-volatile storage device 10 as, for example, cache memory.

The non-volatile storage device 10 may include a data register (not shown) for holding data read from the memory cell array 20. Alternatively, the data register may be provided outside the non-volatile storage device 10 as, for example, cache memory. Alternatively, the data register may be a partial area of the memory array and the memory cells in that area may be in the variable state.

Figure 7:
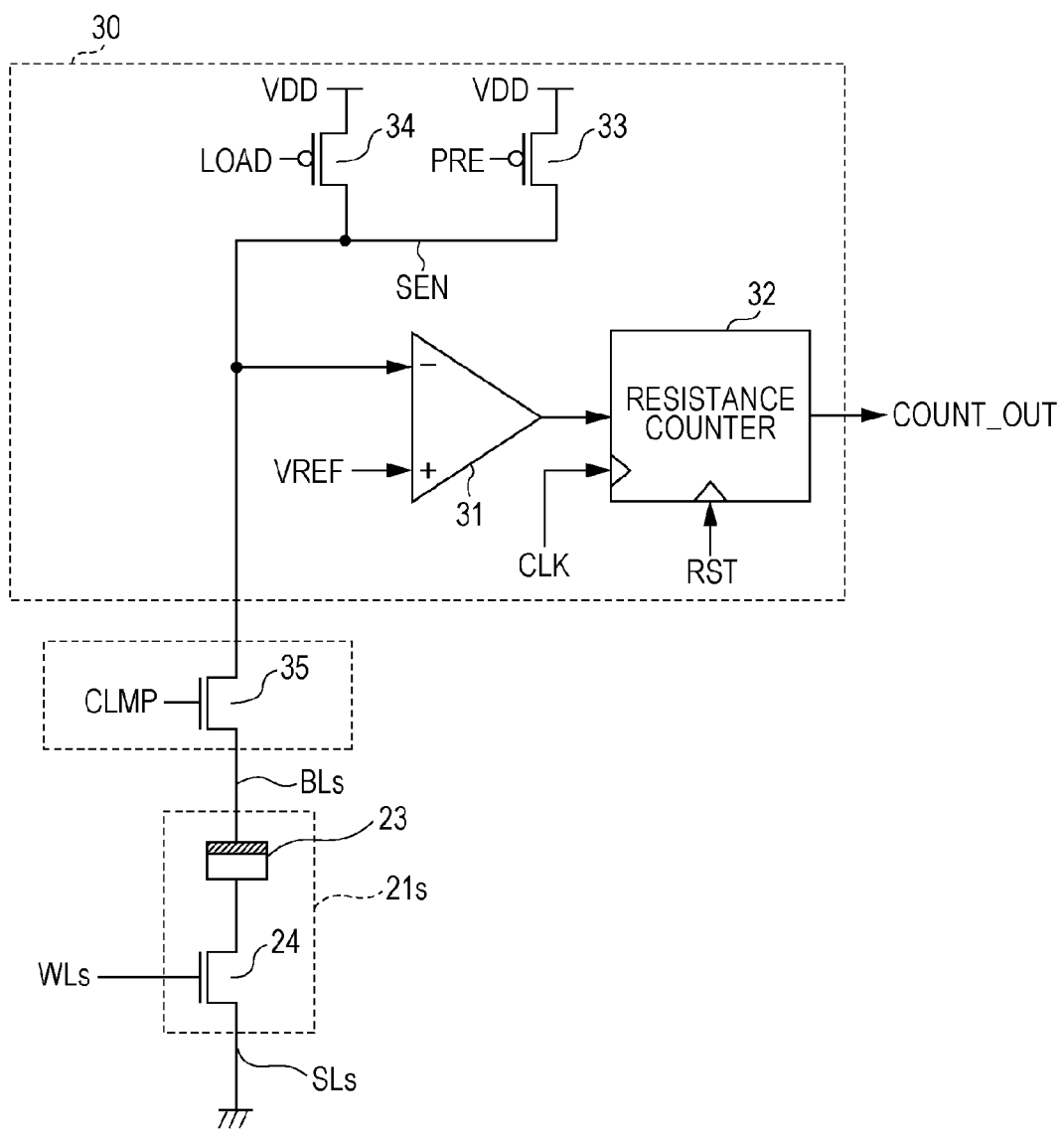
FIG. 7 is a circuit diagram showing a structure of a read circuit included in the non-volatile storage device in the first exemplary embodiment.

FIG. 7 is a circuit diagram showing an exemplary structure of the read circuit included in the non-volatile storage device in the first exemplary embodiment.

The read circuit 11 has a discharging sense amplifier circuit 30. The sense amplifier 30 obtains the discharge time of a capacitor or wiring capacitance (not shown) connected with node SEN as a count value. The count value is a value having correlation with the resistance value of the variable resistance element 23. For example, one end of the capacitor is connected to the node SEN and the other end is connected to ground GND.

The sense amplifier circuit includes a comparator 31, a resistance counter 32, a precharge transistor 33, a load transistor 34, and a clamp transistor 35. In the example shown in FIG. 7, the precharge transistor 33 and the load transistor 34 are PMOS transistors. The clamp transistor 35 is an NMOS transistor. The clamp transistor 35 constitutes a clamp circuit.

To the resistance counter 32, outputs from the comparator 31, a clock signal CLK, and a reset signal RST may be input.

When the reset signal RST becomes low level, the count value of the resistance counter 32 is initialized and the resistance counter 32 starts counting based on the clock signal CLK input from the control circuit 15. The clock signal CLK serves as the reference for converting the discharge time to a count value. The clock signal CLK is a rectangular wave that keeps a certain frequency, for example. The resistance counter 32 increments its count value by one each time the CLK signal is asserted. When the potential of the node SEN has dropped below a reference potential VREF, output of clock signal CLK from the control circuit 15 is stopped. The count value at the time is output as the output of the resistance counter 32, COUNT_OUT.

The source terminal of the precharge transistor 33 is connected with power supply VDD and the drain terminal is connected with the node SEN. To the gate terminal of the precharge transistor 33, precharge control signal PRE is input.

The source terminal of the load transistor 34 is connected with the power supply VDD and the drain terminal is connected with the node SEN. To the gate terminal of the load transistor 34, load control signal LOAD is input.

One of the source terminal and drain terminal of the clamp transistor 35 is connected with the node SEN and the other one is connected with a memory cell. To the gate terminal of the clamp transistor 35, clamp control signal CLMP is input.

<Exemplary Operations>

Figure 8:
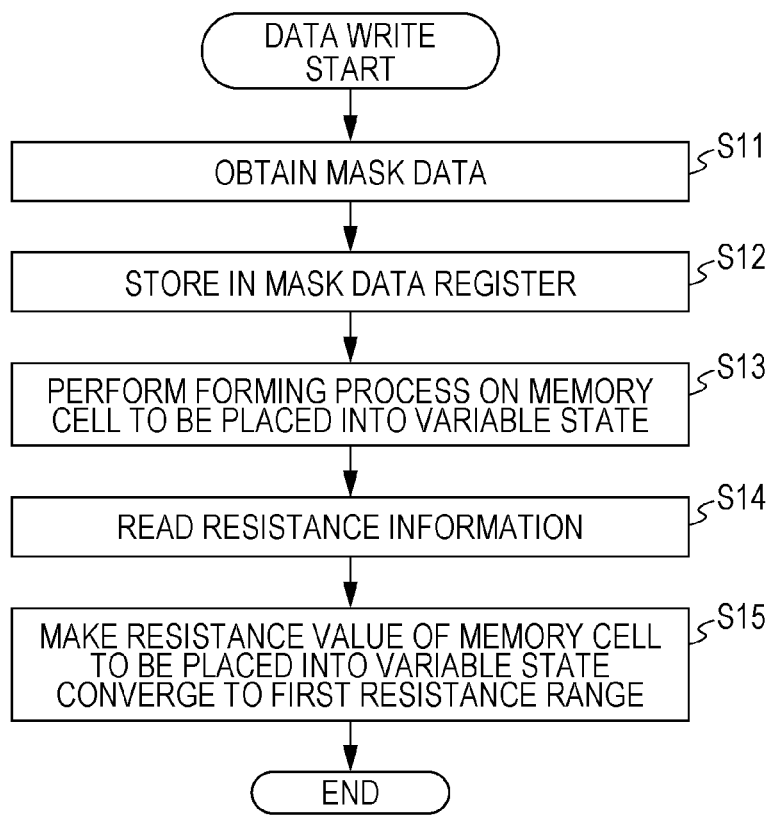
FIG. 8 is a flowchart illustrating the operation of the non-volatile storage device in the first exemplary embodiment.

FIG. 8 is a flowchart illustrating an example of the operation of the non-volatile storage device 10 in the first exemplary embodiment. The operation of the non-volatile storage device 10 will be described below with reference to FIG. 8.

In step S11, mask data is obtained. Mask data is data for grouping the memory cells 21 of the memory cell array 20 into memory cells 21 to be maintained in the initial state and memory cells 21 to be changed into the variable state. In other words, mask data is data that is recorded by making use of the difference of whether the memory cells 21 of the memory cell array 20 are each in the initial state or not. The mask data may be obtained from outside the non-volatile storage device 10 or generated inside the non-volatile storage device 10.

In step S12, the mask data is stored in the mask data register 13.

In step S13, the write circuit 14 receives an address to be changed into the variable state from the mask data register 13 and applies forming stress to the memory cell identified by the address. In the forming process, electrical stress that makes a resistance value in the variable state lower than the second threshold may be applied. In other words, the resistance value of the memory cell 21 may be set within the second resistance range.

In step S14, the read circuit 11 obtains resistance information for the memory cell 21 selected in the memory cell array 20. The resistance information may be the count value COUNT_OUT, for example. The count value COUNT_OUT output from the read circuit 11 is stored in the mask data correcting circuit 12.

In step S15, the resistance value of the memory cell 21 to be changed into the variable state is made to converge to the first resistance range. After this, writing is completed.

Since the resistance values of memory cells to be changed into variable state are made to converge to the first resistance range, written data can be recorded with high stability.

The operation of outputting a count value from the read circuit 11 in step S14 will be described specifically using the configuration of the read circuit 11 illustrated in FIG. 7 and the timing diagram shown in FIG. 9.

Figure 9:
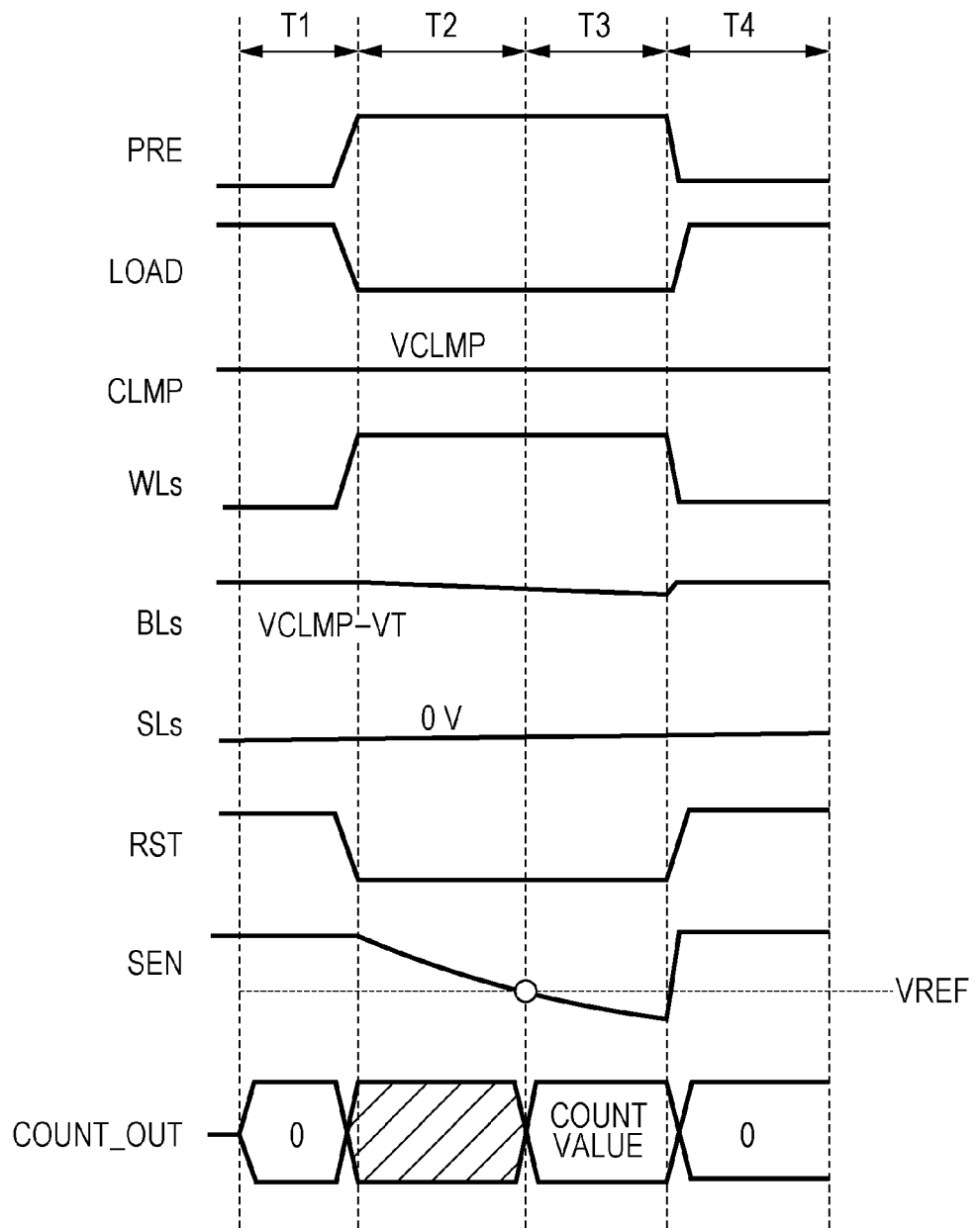
FIG. 9 is a timing diagram illustrating a reading operation in the first exemplary embodiment.

FIG. 9 is a timing diagram illustrating reading from a selected memory cell in the first exemplary embodiment.

Precharge period T1 will be described.

In this period, precharge control signal PRE is low level, which places the precharge transistor 33 in on-state. The load control signal LOAD is high level, which places the load transistor 34 in off-state. The potential of the selected word line WLs is low level, which places the transistor 24 in off-state.

By application of clamping voltage VCLMP to the gate terminal of the clamp transistor 35, the potential of the selected bit line BLs is precharged to the clamping voltage VCLMP minus the threshold voltage VT of the clamp transistor 35. The selected source line SLs is fixed at ground GND. The node SEN is precharged to the potential of the power supply VDD. The reset signal RST for the resistance counter 32 is high level and the output COUNT_OUT of the resistance counter 32 is kept at 0.

Sense period T2 will be described.

In this period, the precharge control signal PRE becomes high level, which places the precharge transistor 33 in off-state. The load control signal LOAD becomes low level, which places the load transistor 34 in on-state. The potential of selected word line WLs becomes high level, which places the transistor 24 in on-state.

The charge accumulated in the capacitor connected with the node SEN starts to be discharged through a current path that passes through the node SEN, the selected bit line BLs, the memory cell 21, and the selected source line SLs. Upon start of the discharge, the reset signal RST becomes low level and the resistance counter 32 starts counting. The comparator 31 compares the potential of the node SEN with the voltage of the reference potential VREF on each count. The resistance counter 32 continues adding count values until the potential of the node SEN drops below the reference potential VREF. As the variable resistance element 23 has a higher resistance value, the discharge time becomes longer and the count value becomes greater. When the node SEN has dropped below the reference potential VREF, the resistance counter 32 stops addition of count values.

Latch time T3 will be described. A latch (not shown) latches the output of the resistance counter 32. The latched count value is output to the mask data correcting circuit 12 as output COUNT_OUT and stored in the mask data correcting circuit 12.

Reset time T4 will be described. When output of the count value is completed, the potential of the selected word line WLs becomes low level, which causes the transistor 24 to turn off. The reading operation then ends.

The operation in step S15 of making the resistance value of the memory cell 21 to be changed into the variable state converge to the first resistance range will be described in detail with reference to FIG. 10.

Figure 13:
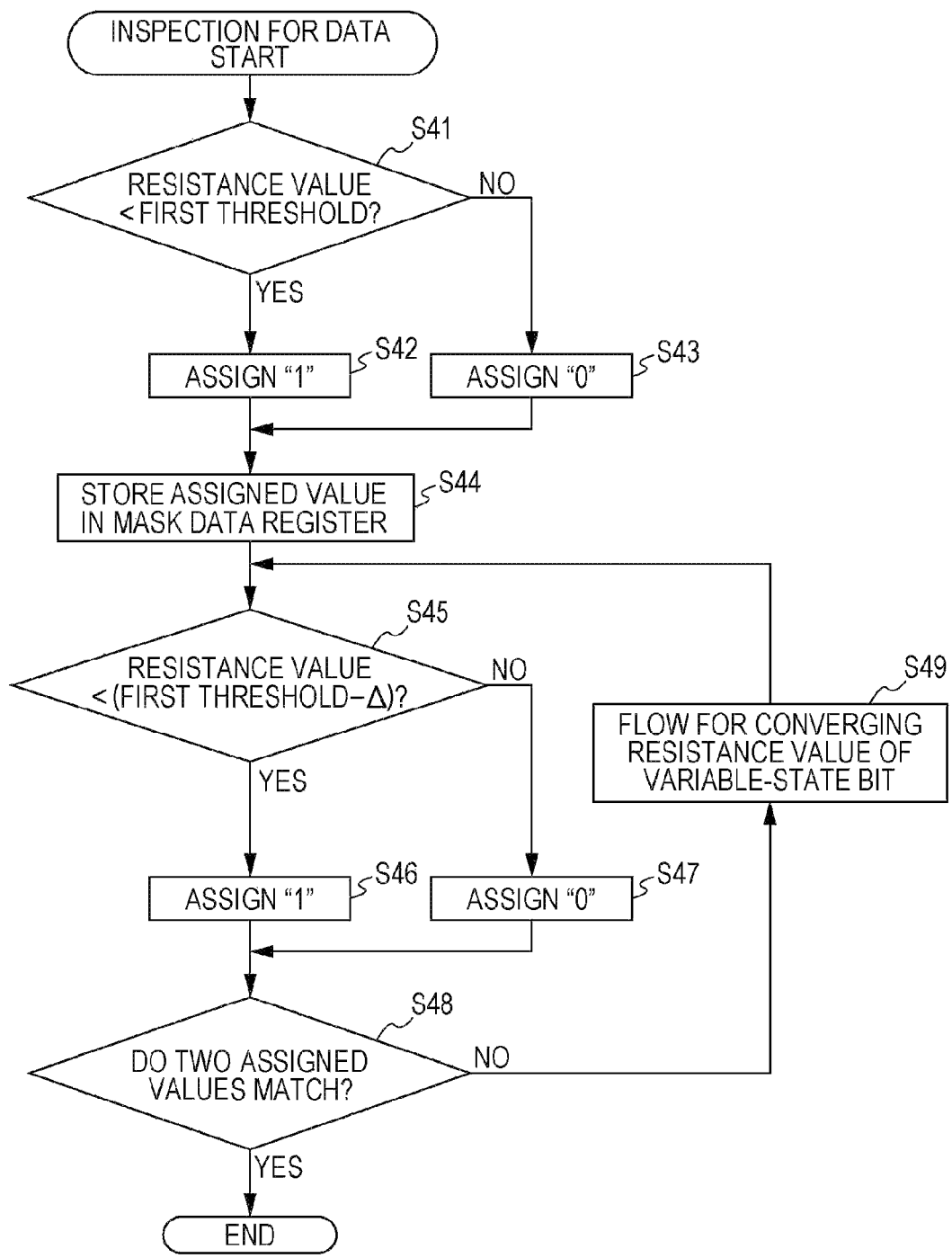
FIG. 13 is a flowchart illustrating an example of the operation of inspecting and correcting the resistance value of a memory cell in a variable state in the non-volatile storage device according to a second exemplary embodiment.

In the example shown in FIG. 13, two operations of determining and correcting the resistance value of a memory cell to be changed into the variable state are carried out.

Steps S21 through S26 show operations for applying the first correction signal.

In step S21, whether the resistance value of the memory cell to be changed into the variable state is equal to or less than the first reference value is determined. It is an option whether the result is defined as Pass or Fail when the resistance value is determined to be equal to the first reference value. In other words, in step S21, only the relation in magnitude between the resistance value and the first reference value may be determined. The first reference value may be set to a value smaller than the first threshold by a certain margin, for example. The first reference value may also be set equal to the first threshold, however.

If the determination at step S21 results in Fail, steps S22 through S26 are executed. In step S22, the first correction voltage pulse is applied to the memory cell. The first correction voltage pulse has negative polarity, for example. In step S23, the first voltage pulse is applied to the memory cell. The first voltage pulse has positive polarity, for example. For instance, the first correction voltage pulse has the same polarity as the second electric signal and the first voltage pulse has the same polarity as the first electric signal. The resistance value of the memory cell accordingly decreases when the first correction voltage pulse is applied and then increases when the first voltage pulse is applied. The absolute value of the voltage and the absolute value of the voltage of the first correction voltage pulse may be greater than the absolute value of the voltage of the first voltage pulse. Pulses including the first correction voltage pulse and the first voltage pulse represent an example of the first correction signal.

In step S24, resistance information is read from the memory cell. In step S25, the resistance value of the memory cell is determined based on the first reference value. If the determination in step S25 results in Fail, step S26 is executed. In step S26, the first correction voltage pulse having an increased pulse width compared to step S22 is set. The flow then returns to step S22; the first correction voltage pulse set in step S26 is applied (step S22), the first voltage pulse is applied (step S23), resistance information is read (step S24), and the resistance value is determined (step S25).

In this manner, steps S22 through S26 are repeated with the pulse width of the first correction voltage pulse sequentially increased until determination in step S25 results in Pass. Increasing the pulse width of the first correction voltage pulse is equivalent to increasing the amount of change by which the first correction voltage pulse decreases the resistance value of the memory cell. Thus, as the pulse width of the first correction voltage pulse becomes longer, the resistance value read in step S24 decreases, for example. If the determination in step S21 or S25 results in Pass, the operation of applying the second correction signal in step S31 and subsequent steps is performed.

Step S31 through S36 show operations for applying the second correction signal.

In step S31, whether the resistance value of the memory cell to be changed into the variable state is equal to or greater than the second reference value is determined. It is an option whether the result is defined as Pass or Fail when the resistance value is determined to be equal to the second reference value. In other words, in step S31, only the relation in magnitude between the resistance value and the second reference value may be determined. The second reference value is set at the second threshold, for example. The second reference value may also be set to the second threshold plus a certain margin, however.

If the determination at step S31 results in Fail, steps S31 through S36 are executed. In step S32, the second voltage pulse is applied to the memory cell. The second voltage pulse has negative polarity, for example. In step S33, the second correction voltage pulse is applied to the memory cell. The second correction voltage pulse has positive polarity, for example. For instance, the second voltage pulse has the same polarity as the second electric signal and the second correction voltage pulse has the same polarity as the first electric signal. The resistance value of the memory cell accordingly decreases with application of the second voltage pulse and then increases with application of the second correction voltage pulse. The absolute value of the voltage of the second correction voltage pulse may be greater than the absolute value of the voltage of the second voltage pulse. Pulses including the second voltage pulse and the second correction voltage pulse represent an example of the second correction signal.

In step S34, resistance information is read from the memory cell. In step S35, the resistance value of the memory cell is determined based on the second reference value. If the determination in step S35 results in Fail, step S36 is executed. In step S36, the second correction voltage pulse with an increased pulse width compared to step S32 is set. The flow then returns to step S32; the second voltage pulse set in step S36 is applied (step S32), the second correction voltage pulse is applied (step S33), resistance information is read (step S34), and the resistance value is determined (step S35).

In this manner, steps S32 through S36 are repeated with the pulse width of the second correction voltage pulse sequentially increased until the determination in step S35 results in Pass. Increasing the pulse width of the second correction voltage pulse is equivalent to increasing the amount of change by which the second correction voltage pulse increases the resistance value of the memory cell. Thus, as the pulse width of the second correction voltage pulse becomes longer, the resistance value read in step S34 increases, for example. If the determination in step S31 or step S35 results in Pass, operations for making the resistance value of the memory cell converge to the first resistance range ends (END).

In the illustrated operations, the correction voltage pulse, which is applied to a memory cell whose resistance value is outside the range between the first reference value and the second reference value, is sequentially increased. Applying an optimal voltage stress to each memory cell can make its resistance value converge. When the magnitude of voltage stress is adjusted with the pulse width of the correction voltage pulses, fine adjustment of voltage stress is facilitated and controllability is enhanced.

The resistance value of a memory cell which has undergone the flow shown in FIG. 13 has been set to a value smaller than the first threshold and greater than the second threshold. Data recorded by making use of the difference between the initial state and the variable state is read using the first threshold. By configuring the non-volatile storage device to perform reading using the first threshold only when a hidden command is input, for example, highly secure data recording can be achieved.

In step S26, instead of sequentially increasing the pulse width on each repetition of steps S22 through S26, the absolute value of voltage may be sequentially increased. In step S36, instead of sequentially increasing the pulse width on each repetition of steps S32 through S36, the absolute value of voltage may be sequentially increased.

Steps S21 through S26 may be executed after execution of steps S31 through S36.

In steps S21, S25, S31, and S35 at which the resistance value is determined, the magnitude of the resistance value may be determined directly or determined indirectly by deciding the magnitude of a physical quantity correlated to the resistance (for example, counter value).

Figure 10:
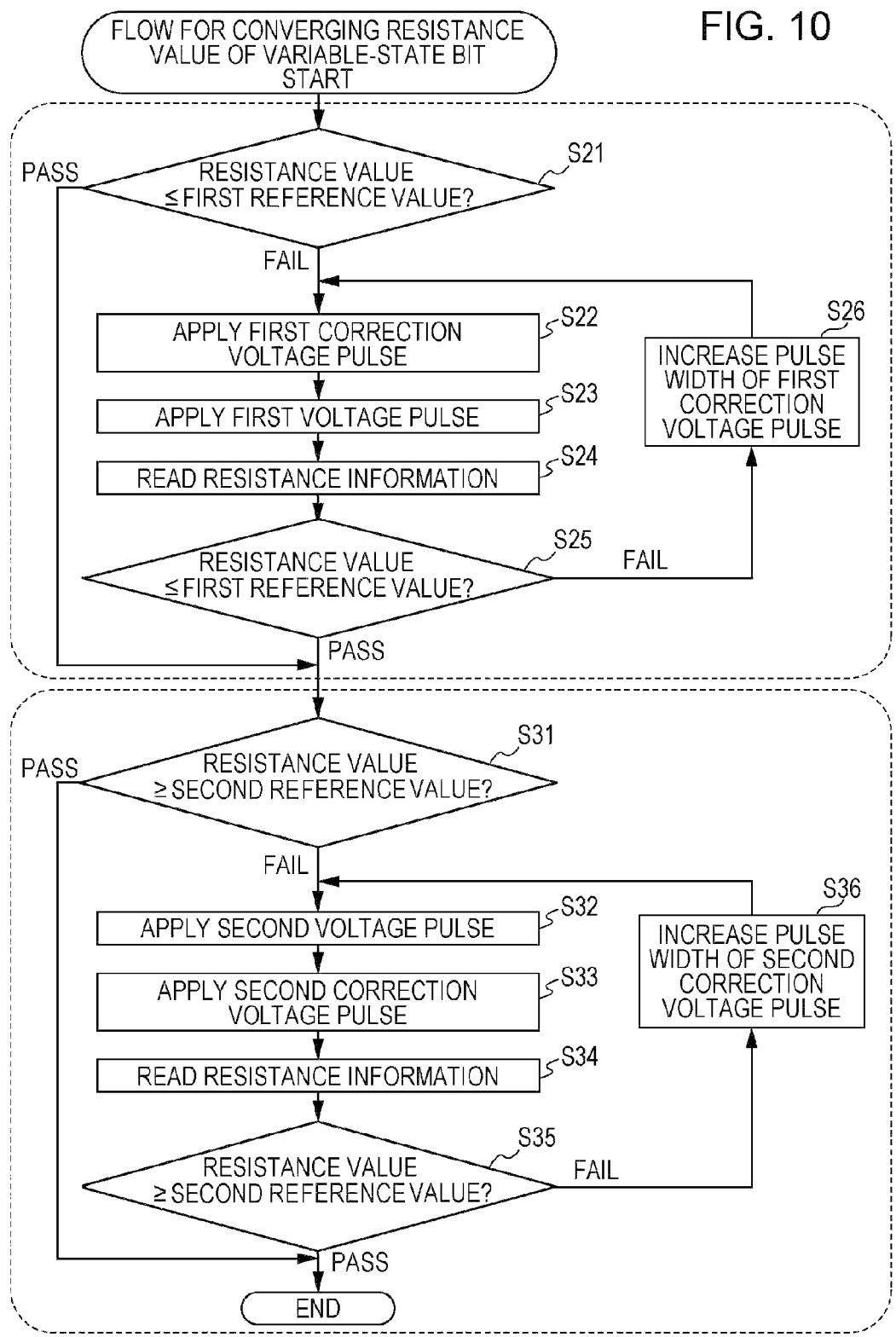
FIG. 10 is a flowchart showing the operation of making the resistance value of a memory cell in a variable state converge in the non-volatile storage device in the first exemplary embodiment.

FIG. 11A shows an example of distribution of resistance values before and after execution of steps S21 through S26 in FIG. 10. FIG. 11B shows an example of distribution of resistance values before and after execution of steps S31 through S36 in FIG. 10. In FIGS. 11A and 11B, the leftmost broken line indicates the current corresponding to the lower limit of the initial resistance range, and the rightmost broken line indicates the current corresponding to the boundary between the first resistance range and the second resistance range. In FIGS. 11A and 11B, the second broken line from the left indicates the current corresponding to the first reference value and the third broken line from the left indicates the current corresponding to the second reference value.

The conditions concerning FIGS. 11A and 11B were as follows. Memory cells had the following constitutions. Each memory cell had a rectangular shape of about 400 nm×400 nm. The material of the bottom electrode was TaN, that of the top electrode was iridium, and that of the variable resistance layer was tantalum oxide. The variable resistance layer included the first variable resistance layer and the second variable resistance layer. The thickness of the bottom electrode was about 50 nm and that of the top electrode was about 100 nm. The first variable resistance layer was about 65 nm and the second variable resistance layer was about 5 nm in thickness.

Voltage pulses had the following voltage magnitudes and pulse widths. The first voltage pulse had a magnitude of +1.5 V and a pulse width of 50 ns. The first correction voltage pulse had a magnitude of −2.4 V and a pulse width of 50 ns. The second voltage pulse had a magnitude of −2.4 V and a pulse width of 50 ns. The second correction voltage pulse had a magnitude of +1.4 V and a pulse width of 50 ns.

Each time step S26 and step S36 were repeated, the pulse width was increased twofold. That is, the pulse width of the correction voltage pulse on the first execution was 50 ns, the pulse width of the correction voltage pulse on the second execution was 100 ns, the pulse width of the correction voltage pulse on the third execution was 200 ns, and the pulse width of the correction voltage pulse on the fourth execution was 400 ns.

Data points indicated by white triangles in FIG. 11A indicate the cell currents of memory cells before steps S21 through S26 were performed. Before step S21 through S26 were performed, some memory cells had cell currents smaller than the current corresponding to the first reference value. These memory cells had resistance values greater than the first reference value. Data points represented by black squares in FIG. 11A indicate the cell currents of the memory cells after steps S21 through S26 were performed. After steps S21 through S26 were performed, all of the memory cells had cell currents greater than the current corresponding to the first reference value. Stated differently, by going through steps S21 to S26, the resistance values of all the memory cells became smaller than the first reference value.

After executing steps S21 through S26, steps S31 through S36 were executed. Data points represented by white triangles in FIG. 11B indicate the cell currents of memory cells before steps S31 through S36 were performed. The data points correspond to those indicated by black squares in FIG. 11A. Before steps S31 through S36 were performed, some memory cells had cell currents greater than the current corresponding to the second reference value. These memory cells had resistance values smaller than the second reference value. Data points represented by black squares in FIG. 11B indicate the cell currents of the memory cells after steps S31 through S36 were performed. After steps S31 through S36 were performed, the cell currents of all of the memory cells became smaller than the current corresponding to the second reference value. Stated differently, by going through steps S31 to S36, the resistance values of all the memory cells became greater than the second reference value.

As illustrated in FIGS. 11A and 11B, through steps S21 to S26 and steps S31 to S36, distribution of the resistance values of the memory cells converged to the range from the second reference value to the first reference value inclusive.

Figure 12:
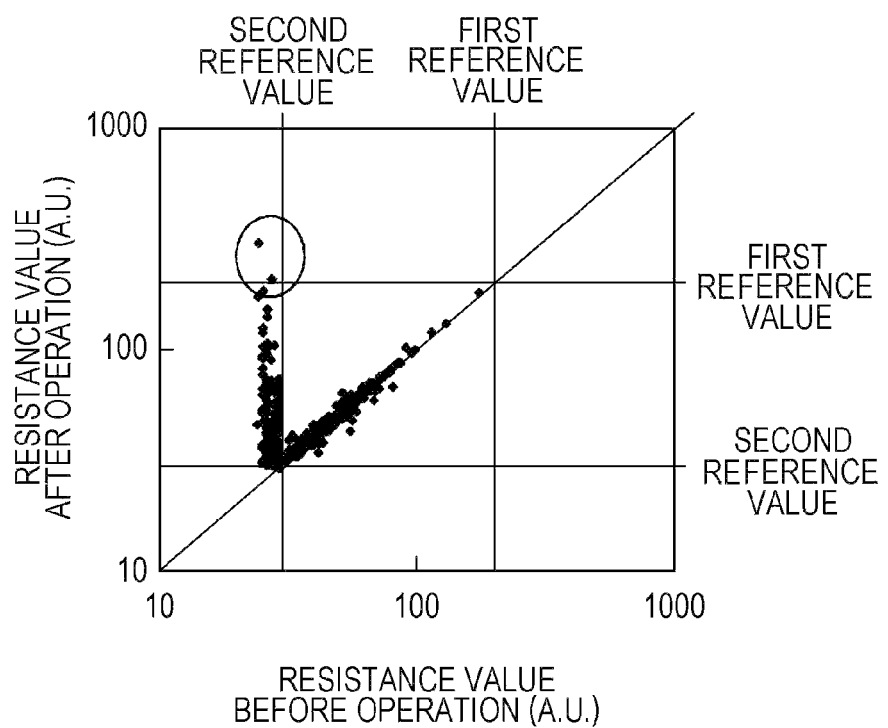
FIG. 12 shows an example of distribution of resistance values before and after execution of another flow for making the resistance value of a memory cell in a variable state converge.

FIG. 12 shows an example of distribution of resistance values before and after execution of a flow that is similar to the one shown in FIG. 10 except steps S26 and S36. More specifically, instead of changing the voltage value and pulse width of the correction voltage pulses in step S26 and S36 of FIG. 10, the same correction pulse was applied repeatedly when a correction voltage pulse was applied to a memory cell multiple times.

In the example shown in FIG. 12, since the resistance values of all the memory cells were equal to or smaller than the first reference value, the determination in step S21 resulted in Pass. As no correction signal was applied to memory cells having a resistance value equal to or greater than the second reference value, the resistance values remained almost unchanged before and after the execution of the flow operations. These memory cells were almost aligned on a straight line y=x as shown in FIG. 12.

To those memory cells that had a resistance value lower than the second reference value, application of the second voltage pulse and the second correction voltage pulse was repeated until the resistance value reached at least the second reference value. As a result, the resistance values of those memory cells increased to values equal to or greater than the second reference value. However, the resistance values of some memory cells indicated in the circle in FIG. 12 exceeded the first reference value.

This is probably because of the following reason. Since in this experiment the voltage value and pulse width of correction voltage pulses were fixed, stress with the same conditions was applied to memory cells which were determined to be Fail in step S35. Even if stress with the same conditions is applied to the memory cells, however, their resistance values do not always change to the same value or by the same amount. This is because the resistance value of the variable resistance element in a memory cell varies depending on the number or thickness of filaments that are probabilistically formed as mentioned above. That is, for those memory cells that exceeded the first reference value in FIG. 12, the stress of the correction voltage pulse applied seems to have been too large. On the other hand, if the voltage value of the correction voltage pulse is decreased or the pulse width is shortened, the resistance value of the memory cell may not exceed the second reference value even after repeated application of the correction voltage pulse or the number of applications of the correction voltage pulse required before the resistance value exceeds the second reference value may increase.

In the flow illustrated in FIG. 10, in contrast, the pulse widths of correction voltage pulses are increased in steps S26 and S36, and stress is gradually increased as a function of the number of times the determination at step S25 or S35 results in Fail. This enables application of an optimal stress to each memory cell.

As can be seen from FIGS. 11A, 11B, and 12, the first exemplary embodiment increases the pulse widths of the correction voltage pulses to enable optimal stress to be applied to each memory cell. Accordingly, the resistance values of memory cells can efficiently converge to the range from the second reference value to the first reference value inclusive.

Second Exemplary Embodiment
<Device Configuration>

The second exemplary embodiment shows another example of the non-volatile storage device according to the present disclosure. The non-volatile storage device in the second exemplary embodiment may be similarly configured to the first exemplary embodiment (see FIGS. 6 and 7). Thus, components that are common in the first and second exemplary embodiments may be given the same reference characters and names, and detailed description of such components may be omitted.

<Exemplary Operations>

FIG. 13 is a flowchart illustrating an example of the operation of the non-volatile storage device in the second exemplary embodiment. The operation of the variable resistance non-volatile storage device in the second exemplary embodiment will be described with reference to FIG. 13.

In the second exemplary embodiment, data in a memory cell array is inspected and corrected, the data written by making use of the difference of whether memory cells are each in the initial state or the variable state. The inspection is performed after the elapse of a predetermined time after data is written in the memory cell array, for example. The data may be written through similar operations to the first exemplary embodiment (FIGS. 8 and 10), for example.

When a control signal including an instruction for data inspection is input to the control circuit 15, operations for inspecting and correcting the resistance values of memory cells in the variable state start (START). Although FIG. 13 only shows a flow for detecting a memory cell whose resistance value is near a first threshold within the first resistance range, a flow for detecting a memory cell whose resistance value is near a second threshold within the first resistance range may be similarly implemented.

In step S41, the resistance value of a memory cell 21 is read by the read circuit 11 and the relation in magnitude between the resistance value and the first reference value is determined. When the resistance value is less than the first threshold in the determination, "1" is assigned to a bit of data (step S42); when the resistance value is equal to or greater than the first threshold, "0" is assigned to the bit of data (step S43). The assigned value is stored in a mask data register at step S44.

In step S45, the relation in magnitude between the resistance value of the memory cell 21 and a reference value which is a value smaller than the first threshold is determined. The reference value is set to the first threshold minus Δ, where Δ is a positive number greater than 0 and smaller than the first threshold, for example. When the resistance value is determined to be less than the first threshold, "1" is assigned to a bit of inspection data (step S46); when the resistance value is equal to or greater than the first threshold, "0" is assigned to the bit of inspection data (step S47).

In step S48, the value assigned in steps S45 through S47 is compared with the value stored in the mask data register at step S44. Those two values are based on the common resistance value obtained from the same memory cell. If the two values do not match, the determination results in NO. This indicates that the resistance value of the memory cell corresponding to the non-matching bit exceeds the reference value. For example, if a memory cell whose resistance value has increased close to the first threshold is neglected, it can cause a read error and the like. Thus, when the determination at step S48 results in NO, the operation of making the resistance value of the memory cell 21 converge to the first resistance range is executed in step S49. In step S49, the flow shown in FIG. 10 is executed, for example. When the determination in step S48 results in YES, the inspection and correcting operations end. Note that the inspection and correction (steps S45 through S49) may be performed at each time the allocation to one bit is completed, or may be performed after the allocation to all bits is completed.

The non-volatile storage device according to the second exemplary embodiment may periodically inspect and correct data recorded in the memory cell array. This can reduce the possibility of data degradation due to change over time and improve data retention properties.

The inspection operation may not be executed at certain time intervals. For example, the non-volatile storage device may count the number of reading operations and execute the inspection operation if it exceeds a predetermined number of times.

The first and second exemplary embodiments also permit similar variations to the aforementioned embodiment. The first and second exemplary embodiments may be combined as necessary. The second exemplary embodiment also permits similar variations to the first exemplary embodiment.

From the foregoing description, many improvements to and/or other embodiments of the present disclosure will be apparent to those skilled in the art. The foregoing description therefore should be construed only as illustration.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A data recording method comprising:
   recording data in a plurality of memory cells on the basis of whether each of the plurality of memory cells is in an initial state in which a resistance value thereof is within an initial resistance range, or a variable state in which the resistance value thereof reversibly changes between a first resistance range and a second resistance range in response to application of an electric signal,
   wherein the recording step includes:
   (A) applying a forming stress to a memory cell selected from the plurality of memory cells in the initial state, and
   (B) setting the resistance value of the selected memory cell to within the first resistance range, which lies between the initial resistance range and the second resistance range without overlap, by (b1) applying a first correction signal to the selected memory cell to decrease the resistance value of the selected memory cell if the resistance value of the selected memory cell is greater than a first reference value which is within the first resistance range, and (b2) applying a second correction signal to the selected memory cell to increase the resistance value of the selected memory cell if the resistance value of the selected memory cell is smaller than a second reference value which is within the first resistance range and smaller than the first reference value.

2. The data recording method according to claim 1, wherein the step (b1) repeats a cycle including
   determining whether the resistance value of the selected memory cell is equal to or smaller than the first reference value, and
   applying a first correction signal to the memory cell if the resistance value of the selected memory cell is greater than the first reference value, while lengthening a width of the first correction voltage pulse as a number of repeat times of the cycle increases, and
   the first correction voltage pulse has the same polarity as a second electric signal for lowering a resistance value of a memory cell in the variable state from the first resistance range to the second resistance range.

3. The data recording method according to claim 1, wherein the step (b2) repeats a cycle including
  determining whether the resistance value of the selected memory cell is equal to or greater than the second reference value, and
  applying a second correction signal to the memory cell if the resistance value of the selected memory cell is smaller than the second reference value, while lengthening a width of the second correction voltage pulse as a number of repeat times of the cycle increases, and
  the second correction voltage pulse has the same polarity as a first electric signal for heightening a resistance value of a memory cell in the variable state from the second resistance range to the first resistance range.

4. The data recording method according to claim 2, further comprising:
  (A1) setting, after step (A) but before step (B), the resistance value of the selected memory cell within the second resistance range, and
  (A2) applying, after step (A1) but before step (B), a preliminary electric signal to the selected memory cell,
  wherein the preliminary electric signal is weaker than a first electric signal for heightening a resistance value of a memory cell in the variable state from the second resistance range to the first resistance range, and has the same polarity as the first electric signal.

5. The data recording method according to claim 3, further comprising:
  (A1) setting, after step (A) but before step (B), the resistance value of the selected memory cell within the second resistance range, and
  (A2) applying, after step (A1) but before step (B), a preliminary electric signal to the selected memory cell,
  wherein the preliminary electric signal is weaker than a first electric signal for heightening a resistance value of a memory cell in the variable state from the second resistance range to the first resistance range, and has the same polarity as the first electric signal.

6. The data recording method according to claim 2, wherein
  the first correction signal includes the first correction voltage pulse and a first voltage pulse which is applied after the first correction voltage pulse, and
  the first voltage pulse has the same polarity as a first electric signal for heightening a resistance value of a memory cell in the variable state from the second resistance range to the first resistance range.

7. The data recording method according to claim 3, wherein
  the second correction signal includes a second voltage pulse and the second correction voltage pulse which is applied after the second electric signal, and
  the second voltage pulse has the same polarity as a second electric signal for lowering a resistance value of a memory cell in the variable state from the first resistance range to the second resistance range.

8. The data recording method according to claim 1, wherein
  (b1) is performed after determining whether the resistance value of the selected memory cell is greater than the first reference value, and
  (b2) is performed after determining whether the resistance value of the selected memory cell is smaller than the second reference value.

9. A non-volatile storage device comprising:
  a memory cell array including a plurality of memory cells, each of which takes an initial state in which a resistance value thereof is within an initial resistance range, or a variable state in which the resistance value thereof reversibly changes between a first resistance range and a second resistance range in response to application of an electric signal; and
  a voltage application circuit operative to record data in the plurality of memory cells on the basis of whether each of the plurality of memory cells is in the initial state or in the variable state,
  wherein, the voltage application circuit is, when recording the data, operative to
    (A) apply a foaming stress to a memory cell selected from the plurality of memory cells in the initial state, and
    (B) set the resistance value of the selected memory cell to within the first resistance range, which lies between the initial resistance range and the second resistance range without overlap, by (b1) applying a first correction signal to the selected memory cell to decrease the resistance value of the selected memory cell if the resistance value of the selected memory cell is greater than a first reference value which is within the first resistance range, and (b2) applying a second correction signal to the selected memory cell to increase the resistance value of the selected memory cell if the resistance value of the selected memory cell is smaller than a second reference value which is within the first resistance range and smaller than the first reference value.

10. The non-volatile storage device according to claim 9, wherein
  each of the plurality of memory cells has a characteristic where, when in the variable state, a resistance value thereof heightens from the second resistance range to the first resistance range in response to application of a first electric signal and lowers from the first resistance range to the second resistance range in response to application of a second electric signal, and
  the voltage application circuit is, in the mode (b1), operative to repeat a cycle including:
    determining whether the resistance value of the selected memory cell is equal to or smaller than the first reference value, and
    applying the first correction signal to the memory cell if the resistance value of the selected memory cell is greater than the first reference value, while lengthening a width of the first correction voltage pulse as a number of repeat times of the cycle increases, the first correction voltage pulse having the same polarity as the second electric signal.

11. The non-volatile storage device according to claim 10, wherein
  the voltage application circuit is further operative to
    set the resistance value of the selected memory cell within the second resistance range after applying the forming stress to the selected memory cell but before setting the resistance value of the selected memory cell within the first resistance range, and
    apply a preliminary electric signal to the selected memory cell after setting the resistance value of the selected memory cell within the second resistance range but before setting the resistance value of the selected memory cell within the first resistance range, and the preliminary electric signal is weaker than the first electric signal, and has the same polarity as the first electric signal.

12. The non-volatile storage device according to claim 10, wherein the first correction signal includes the first correction voltage pulse and a first voltage pulse which is applied after the first correction voltage pulse and has the same polarity as the first electric signal.

13. The non-volatile storage device according to claim 9, wherein
each of the plurality of memory cells has a characteristic where, when in the variable state, a resistance value thereof heightens from the second resistance range to the first resistance range in response to application of a first electric signal and lowers from the first resistance range to the second resistance range in response to application of a second electric signal, and
the voltage application circuit is, in the mode (b2), operative to repeat a cycle including:
determining whether the resistance value of the selected memory cell is equal to or greater than the second reference value, and
applying the second correction signal to the memory cell if the resistance value of the selected memory cell is smaller than the second reference value, while lengthening a width of the second correction voltage pulse as a number of repeat times of the cycle increases, the first correction voltage pulse having the same polarity as the second electric signal.

14. The non-volatile storage device according to claim 13, wherein
the voltage application circuit is further operative to
set the resistance value of the selected memory cell within the second resistance range after applying the forming stress to the selected memory cell but before setting the resistance value of the selected memory cell within the first resistance range, and
apply a preliminary electric signal to the selected memory cell after setting the resistance value of the selected memory cell within the second resistance range but before setting the resistance value of the selected memory cell within the first resistance range, and
the preliminary electric signal is weaker than the first electric signal, and has the same polarity as the first electric signal.

15. The non-volatile storage device according to claim 13, wherein the second correction signal includes a second voltage pulse which has the same polarity as the second electric signal and the second correction voltage pulse which is applied after the second electric signal.

16. The non-volatile storage device according to claim 9, wherein
(b1) is performed after determining whether the resistance value of the selected memory cell is greater than the first reference value, and
(b2) is performed after determining whether the resistance value of the selected memory cell is smaller than the second reference value.

* * * * *